(12) United States Patent
Wei et al.

(10) Patent No.: US 11,721,282 B2
(45) Date of Patent: Aug. 8, 2023

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yulong Wei, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 416 days.

(21) Appl. No.: 16/977,273

(22) PCT Filed: Nov. 28, 2019

(86) PCT No.: PCT/CN2019/121570
§ 371 (c)(1),
(2) Date: Sep. 1, 2020

(87) PCT Pub. No.: WO2021/102791
PCT Pub. Date: Jun. 3, 2021

(65) Prior Publication Data
US 2023/0038017 A1 Feb. 9, 2023

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01);
(Continued)

(58) Field of Classification Search
CPC ......... G09G 3/3233; G09G 2300/0819; G09G 2300/0842; G09G 2300/0861; G09G 2310/08; H01L 27/3276
See application file for complete search history.

(56) References Cited

U.S. PATENT DOCUMENTS 10,510,814 B2   12/2019   Sun et al.
11,010,583 B2    5/2021   Chen et al.
(Continued)

FOREIGN PATENT DOCUMENTS

CN   108242453 A   7/2018
CN   108550602 A   9/2018
(Continued)

OTHER PUBLICATIONS

First Office Action dated Dec. 31, 2021 received in Chinese Patent Application No. CN 201980002688.8 together with an English translation.

*Primary Examiner* — Stacy Khoo
(74) *Attorney, Agent, or Firm* — Scully, Scott, Murphy & Presser, P.C.

(57) ABSTRACT

A display substrate and a display device are provided. The display substrate includes: a base substrate, including a display region; a plurality of pixel units, located in the display region, each of the plurality of pixel units including a pixel circuit structure and a light-emitting element, the light-emitting element including a first electrode, the first electrode being located at a side of the pixel circuit structure away from the base substrate, the plurality of pixel units including a first pixel unit and a second pixel unit that are adjacent to each other in a first direction; a first initialization signal line, extending in the first direction; a light-emitting control signal line, extending in the first direction; a first power line, extending in a second direction, the second direction intersecting with the first direction; a first data line, extending in the second direction, the first data line being connected with the pixel circuit structure of the first pixel unit; a second data line, extending in the second direction, the second data line being connected with the pixel circuit structure of the second pixel unit, the first data line and the second data line being arranged at two sides of the first power line, respectively; and a light transmission hole, an orthographic projection of the light transmission hole on the base substrate being not overlapped with an orthographic projection of the first electrode on the base substrate; the light transmission hole is located in a region enclosed by the first initialization signal line, the light-emitting control signal line, the first power line, and the second data line.

18 Claims, 14 Drawing Sheets

(52) U.S. Cl.
CPC .............. *G09G 2300/0842* (2013.01); *G09G 2300/0861* (2013.01); *G09G 2310/08* (2013.01)

(56) References Cited

U.S. PATENT DOCUMENTS

| | | |
|---|---|---|
| 2014/0098078 A1 | 4/2014 | Jeon et al. |
| 2018/0261663 A1* | 9/2018 | Li .......................... H01L 21/77 |
| 2019/0081090 A1 | 3/2019 | Lee et al. |
| 2020/0411611 A1 | 12/2020 | Liu et al. |

FOREIGN PATENT DOCUMENTS

| | | |
|---|---|---|
| CN | 108878488 A | 11/2018 |
| CN | 110265458 A | 9/2019 |

\* cited by examiner

L2

DISPLAY SUBSTRATE AND DISPLAY DEVICE

CROSS-REFERENCE TO RELATED APPLICATIONS

This application is a national phase entry of PCT International Application No. PCT/CN2019/121570, filed on Nov. 28, 2019. The disclosure of PCT International Application No. PCT/CN2019/121570 is incorporated by reference herein.

TECHNICAL FIELD

At least one embodiment of the present disclosure relates to a display substrate and a display device.

BACKGROUND

With advent of an era of full-screen display devices such as mobile phones, identification of fingerprint-on-display has been widely studied.

SUMMARY

At least one embodiment of the present disclosure relates to a display substrate and a display device.

In one aspect, at least one embodiment of the present disclosure provides a display substrate, which includes: a base substrate, including a display region; a plurality of pixel units, located in the display region, each of the plurality of pixel units including a pixel circuit structure and a light-emitting element, the light-emitting element including a first electrode, the first electrode being located at a side of the pixel circuit structure away from the base substrate, the plurality of pixel units including a first pixel unit and a second pixel unit that are adjacent to each other in a first direction; a first initialization signal line, extending in the first direction; a light-emitting control signal line, extending in the first direction; a first power line, extending in a second direction, the second direction intersecting with the first direction; a first data line, extending in the second direction, the first data line being connected with the pixel circuit structure of the first pixel unit; a second data line, extending in the second direction, the second data line being connected with the pixel circuit structure of the second pixel unit, the first data line and the second data line being arranged at two sides of the first power line, respectively; and a light transmission hole, an orthographic projection of the light transmission hole on the base substrate being not overlapped with an orthographic projection of the first electrode on the base substrate; the light transmission hole is located in a region enclosed by the first initialization signal line, the light-emitting control signal line, the first power line, and the second data line.

For example, a distance between the second data line and the first power line is greater than a distance between the first data line and the first power line.

For example, the pixel circuit structure further includes a first light-emitting control transistor and a second light-emitting control transistor, the first light-emitting control transistor includes a first electrode and a second electrode, and the first electrode and the second electrode of the first light-emitting control transistor are located at a first side and a second side of the light-emitting control signal line, respectively, the second light-emitting control transistor includes a first electrode and a second electrode, and the second electrode and the first electrode of the second light-emitting control transistor are located at the first side and the second side of the light-emitting control signal line, respectively, the first side and the second side are opposite sides of the light-emitting control signal line, and the light transmission hole is located between the first electrode of the first light-emitting control transistor and the second electrode of the second light-emitting control transistor.

For example, a gate electrode of the first light-emitting control transistor and a gate electrode of the second light-emitting control transistor are both connected with the light-emitting control signal line.

For example, the first light-emitting control transistor, the light transmission hole, and the second light-emitting control transistor are arranged in the first direction.

For example, the pixel circuit structure further includes a driving transistor located at the second side of the light-emitting control signal line, the first electrode and the second electrode of the first light-emitting control transistor are electrically connected with the first power line and a first electrode of the driving transistor, respectively, the first electrode and the second electrode of the second light-emitting control transistor are electrically connected with a second electrode of the driving transistor and the first electrode of the light-emitting element, respectively.

For example, the display substrate further includes a second initialization signal line, a first reset control signal line, and a second reset control signal line; the pixel circuit structure further includes a first reset transistor and a second reset transistor, a gate electrode of the first reset transistor is electrically connected with the first reset control signal line, a first electrode of the first reset transistor is electrically connected with the second initialization signal line through a first connection electrode, and a second electrode of the first reset transistor is electrically connected with a gate electrode of the driving transistor through a second connection electrode, a gate electrode of the second reset transistor is electrically connected with the second reset control signal line, a first electrode of the second reset transistor is electrically connected with the first initialization signal line through a third connection electrode, and a second electrode of the second reset transistor is electrically connected with the first electrode of the light-emitting element.

For example, the second initialization signal line extends in the first direction, the first reset control signal line extends in the first direction, and the second reset control signal line extends in the first direction.

For example, the light transmission hole is further located between the driving transistor and the second reset transistor.

For example, the driving transistor and the second reset transistor are arranged at two sides of the light transmission hole, respectively, and the two sides of the light transmission hole are opposite to each other in the second direction.

For example, the second reset control signal line, the first initialization signal line, the light-emitting control signal line, the first reset control signal line, and the second initialization signal line are sequentially arranged in the second direction.

For example, the first initialization signal line and the second initialization signal line are electrically connected with each other, or the first initialization signal line and the second initialization signal line are configured to be applied with a same signal.

For example, the display substrate further includes a gate line and a second power line; the pixel circuit structure further includes a storage capacitor, a data writing transistor, and a threshold compensation transistor, a first electrode of the storage capacitor is electrically connected with the first power line, and a second electrode of the storage capacitor is electrically connected with a second electrode of the threshold compensation transistor through the second connection electrode, a gate electrode of the data writing transistor is electrically connected with the gate line, and a first electrode and a second electrode of the data writing transistor of the first pixel unit are electrically connected with the first data line and the first electrode of the driving transistor of the first pixel unit, respectively, a gate electrode of the threshold compensation transistor is electrically connected with the gate line, a first electrode of the threshold compensation transistor is electrically connected with the second electrode of the driving transistor, and the second electrode of the threshold compensation transistor is electrically connected with the gate electrode of the driving transistor through the second connection electrode, and a second electrode of the light-emitting element is electrically connected with the second power line.

For example, an edge of the first power line that is close to the first data line has an equal distance with respect to the first data line at various positions.

For example, the gate line extends in the first direction, and the gate line is located between the light-emitting control signal line and the first reset control signal line.

For example, the second reset control signal line and the gate line are electrically connected with each other, or the second reset control signal line and the gate line are configured to be applied with a same signal.

For example, the first connection electrode, the second connection electrode, the third connection electrode, the first data line, the second data line, and the first power line are located in a same layer.

For example, a size of the light transmission hole in the first direction is in a range from 5 μm to 15 μm, and a size of the light transmission hole in the second direction is in a range from 5 μm to 15 μm.

At least one embodiment of the present disclosure further provides a display device, including any one of the display substrates as described above.

In the other aspect, at least one embodiment of the present disclosure further provides a display substrate, which includes: a pixel circuit structure, the pixel circuit structure including a first light-emitting control transistor and a second light-emitting control transistor; a light-emitting control signal line, a gate electrode of the first light-emitting control transistor and a gate electrode of the second light-emitting control transistor being both connected with the light-emitting control signal line; a light-emitting element, including a first electrode, the first electrode being located at a side of the pixel circuit structure away from the base substrate; and a light transmission hole, located between the first light-emitting control transistor and the second light-emitting control transistor, an orthographic projection of the light transmission hole on the base substrate being not overlapped with an orthographic projection of the first electrode on the base substrate.

For example, a distance between the first data line and the first power line is less than a distance between the second data line and the first power line.

For example, the light-emitting control signal line extends in a first direction, and the first light-emitting control transistor, the light transmission hole, and the second light-emitting control transistor are arranged in the first direction.

For example, the display substrate further includes a first power line, the light transmission hole is located at a first side of the light-emitting control signal line, the pixel circuit structure further includes a driving transistor located at a second side of the light-emitting control signal line, the first side and the second side are opposite sides of the light-emitting control signal line, a first electrode and a second electrode of the first light-emitting control transistor are electrically connected with the first power line and a first electrode of the driving transistor, respectively, a first electrode and a second electrode of the second light-emitting control transistor are electrically connected with a second electrode of the driving transistor and the first electrode of the light-emitting element, respectively, and the first power line extends in a second direction, and the second direction intersects with the first direction.

For example, the display substrate further includes a first initialization signal line, a second initialization signal line, a first reset control signal line, and a second reset control signal line; the pixel circuit structure further includes a first reset transistor and a second reset transistor, a gate electrode of the first reset transistor is electrically connected with the first reset control signal line, a first electrode of the first reset transistor is electrically connected with the second initialization signal line through a first connection electrode, and a second electrode of the first reset transistor is electrically connected with a gate electrode of the driving transistor through a second connection electrode, and a gate electrode of the second reset transistor is electrically connected with the second reset control signal line, a first electrode of the second reset transistor is electrically connected with the first initialization signal line through a third connection electrode, and a second electrode of the second reset transistor is electrically connected with the first electrode of the light-emitting element.

For example, the first initialization signal line extends in the first direction, the second initialization signal line extends in the first direction, the first reset control signal line extends in the first direction, and the second reset control signal line extends in the first direction.

For example, the light transmission hole is further located between the driving transistor and the second reset transistor.

For example, the driving transistor and the second reset transistor are arranged at two sides of the light transmission hole, respectively, and the two sides of the light transmission hole are opposite to each other in the second direction.

For example, the light transmission hole is further located between the first initialization signal line and the light-emitting control signal line.

For example, the second reset control signal line, the first initialization signal line, the light-emitting control signal line, the first reset control signal line, and the second initialization signal line are sequentially arranged in the second direction.

For example, the first initialization signal line and the second initialization signal line are electrically connected with each other, or the first initialization signal line and the second initialization signal line are configured to be applied with a same signal.

For example, the display substrate further includes a gate line, a data line and a second power line; the pixel circuit structure further includes a storage capacitor, a data writing transistor, and a threshold compensation transistor, a first electrode of the storage capacitor is electrically connected with the first power line, and a second electrode of the storage capacitor is electrically connected with a second electrode of the threshold compensation transistor through the second connection electrode, a gate electrode of the data writing transistor is electrically connected with the gate line, and a first electrode and a second electrode of the data writing transistor are electrically connected with the data line and the first electrode of the driving transistor, respectively, a gate electrode of the threshold compensation transistor is electrically connected with the gate line, a first electrode of the threshold compensation transistor is electrically connected with the second electrode of the driving transistor, and the second electrode of the threshold compensation transistor is electrically connected with the gate electrode of the driving transistor through the second connection electrode, and a second electrode of the light-emitting element is electrically connected with the second power line.

For example, an edge of the first power line that is close to the data line has an equal distance with respect to the data line at various positions.

For example, the gate line extends in the first direction, and the gate line is located between the light-emitting control signal line and the first reset control signal line.

For example, the data line extends in the second direction, and the first power line extends in the second direction.

For example, the second reset control signal line and the gate line are electrically connected with each other, or the second reset control signal line and the gate line are configured to be applied with a same signal.

For example, the first connection electrode, the second connection electrode, the third connection electrode, the data line, and the first power line are located in a same layer.

For example, a size of the light transmission hole in the first direction is in a range from 5 μm to 15 μm, and a size of the light transmission hole in the second direction is in a range from 5 μm to 15 μm.

At least one embodiment of the present disclosure further provides a display device, including any one of the display substrates as described above.

BRIEF DESCRIPTION OF THE DRAWINGS

In order to clearly illustrate the technical solution of the embodiments of the present disclosure, the drawings of the embodiments will be briefly described in the following. It is obvious that the described drawings are only related to some embodiments of the present disclosure and thus are not limitative of the present disclosure.

DETAILED DESCRIPTION

Figure 1:
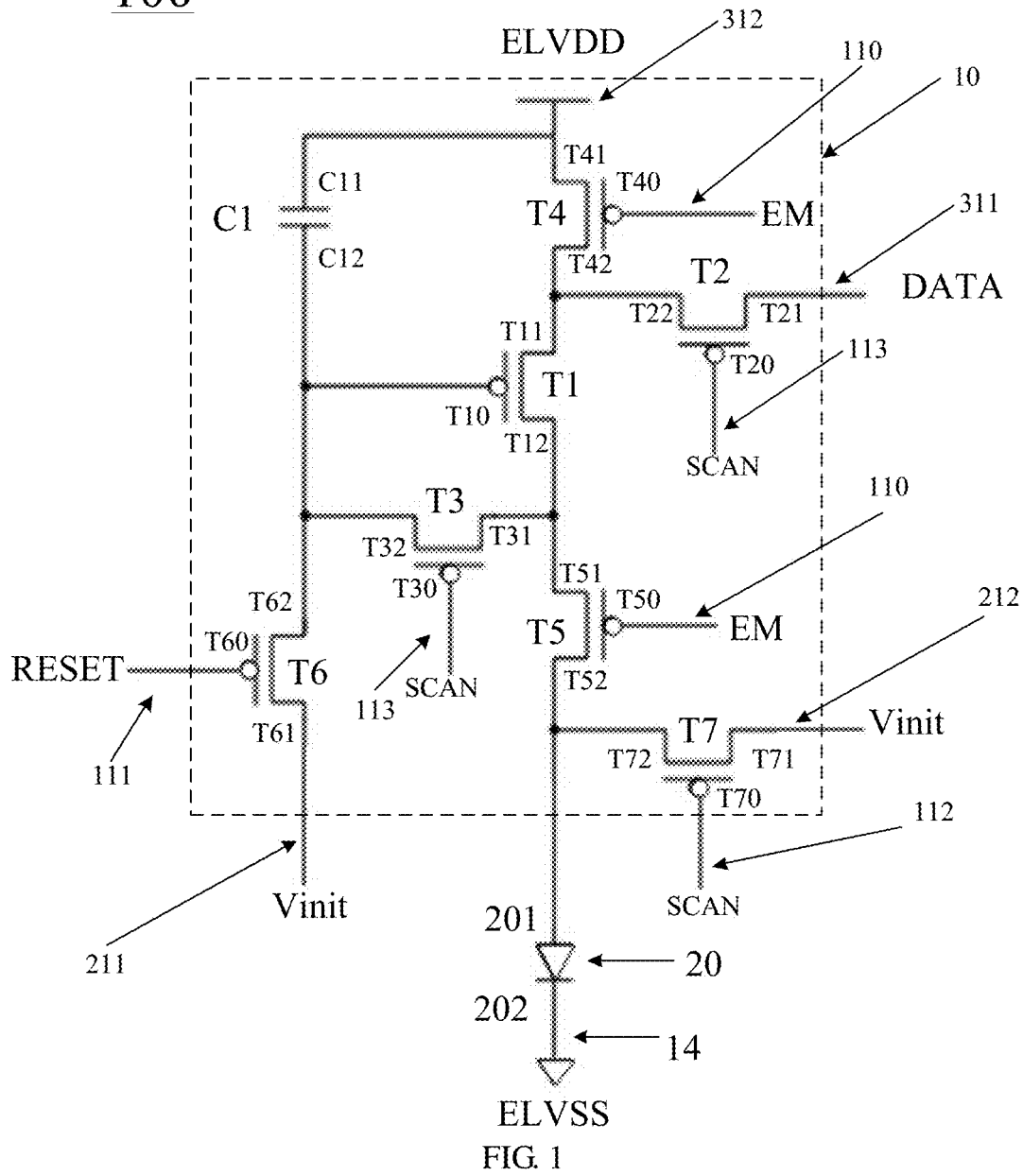
FIG. 1 is a principle diagram of a pixel circuit structure of a display panel provided by an embodiment of the present disclosure.

For more clear understanding of the objectives, technical details and advantages of the embodiments of the present disclosure, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected" and the like are not limited to a physical or mechanical connection, but also include an electrical connection, either directly or indirectly. "On," "under," "right," "left" and the like are only used to indicate relative position relationship, and when the position of the described object is changed, the relative position relationship may be changed accordingly.

A conventional identification solution of fingerprint-on-display designed on a principle of pinhole imaging is as follows. An imaging pinhole is designed in a pixel unit in a display region of a display panel; during fingerprint identification, light emitted from a light-emitting element in the display panel is reflected by a fingerprint, passes through the pinhole, and reaches a sensor, thereby realizing a fingerprint identification function. In order to ensure an effect of the fingerprint identification function, metal wirings (lines) should not be arranged within a range of the pinhole.

As Pixels Per Inch (PPI) of screens increases, space for designing a single pixel unit becomes smaller and smaller. For example, in an organic light-emitting diode display panel, in the case where a pixel circuit structure of a single pixel unit includes a plurality of transistors, such as 7 or more transistors, wiring design within the pixel unit is already close to a limit of a current process, so it is necessary to find a best position for designing the imaging pinhole. For example, the pixel circuit structure includes a 7T1C pixel circuit structure, without limited thereto. The embodiments of the present disclosure are described with reference to the case where the pixel circuit structure is a 7T1C pixel circuit structure, by way of example.

Figure 2:
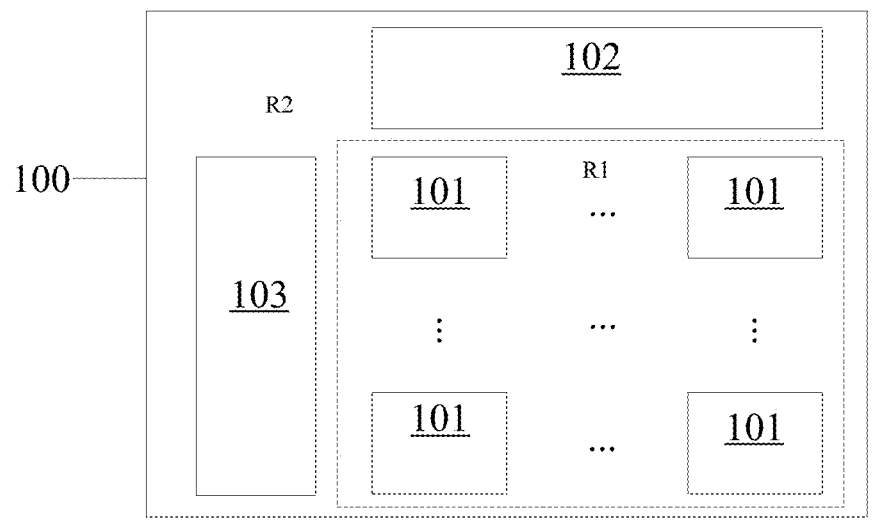
FIG. 2 is a planar diagram of a structure of a display panel provided by an embodiment of the present disclosure.

FIG. 1 is a principle diagram of a pixel circuit structure of a display panel provided by an embodiment of the present disclosure. FIG. 2 is a planar diagram of a structure of a display panel provided by an embodiment of the present disclosure. Referring to FIG. 1 and FIG. 2 together, the display panel 100 includes a plurality of pixel units 101 arranged in a matrix; each pixel unit 101 includes a pixel circuit structure 10, a light-emitting element 20, as well as a gate line 113, a data line 311, and a voltage signal line. For example, the light-emitting element 20 is an organic light-emitting diode (OLED); and the light-emitting element 20 emits red light, green light, blue light, or white light, etc. as driven by a corresponding pixel circuit structure 10. There may be one voltage signal line, or there may be a plurality of voltage signal lines. For example, as illustrated in FIG. 1, the voltage signal line includes at least one selected from the group consisting of a first power line 312, a second power line 14, a light-emitting control signal line 110, a first initialization signal line 212, a second initialization signal line 211, a first reset control signal line 111, and a second reset control signal line 112, etc. The gate line 113 is configured to supply a scan signal SCAN to the pixel circuit structure 10. The data line 311 is configured to supply a data signal DATA to the pixel circuit structure 10. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, without limited thereto. The number of pixel units included in one pixel and light output of each pixel unit may be determined according to needs.

For example, the first power line 312 is configured to supply a constant first voltage signal ELVDD to the pixel circuit structure 10; the second power line 14 is configured to supply a constant second voltage signal ELVSS to the pixel circuit structure 10; and the first voltage signal ELVDD is greater than the second voltage signal ELVSS. The light-emitting control signal line 110 is configured to supply a light-emitting control signal EM to the pixel circuit structure 10. The first initialization signal line 212 and the second initialization signal line 211 are both configured to supply an initialization signal Vint to the pixel circuit structure 10; the first reset control signal line 111 is configured to supply a reset control signal RESET to the pixel circuit structure 10; and the second reset control signal line 112 is configured to supply the scan signal SCAN to the pixel circuit structure 10. The initialization signal Vint is a constant voltage signal, and a magnitude thereof may be between the first voltage signal ELVDD and the second voltage signal ELVSS, without limited thereto. For example, the initialization signal Vint may be less than or equal to the second voltage signal ELVSS.

As illustrated in FIG. 1, the pixel circuit structure 10 includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The driving transistor T1 is electrically connected with the light-emitting element 20, and outputs a driving current to drive the light-emitting element 20 to emit light under control of a signal such as the scan signal SCAN supplied by the gate line 113, the data signal DATA, the first voltage signal ELVDD, and the second voltage signal ELVSS.

In a pixel unit of an organic light-emitting diode display panel, a driving transistor is connected with an organic light-emitting element, and outputs a driving current to the organic light-emitting element, so as to drive the organic light-emitting element to emit light under control of a signal such as a data signal and a scan signal.

For example, as illustrated in FIG. 2, the display panel 100 provided by an embodiment of the present disclosure further includes: a data driving circuit 102 and a scan driving circuit 103. The data driving circuit 102 is configured to supply the data signal DATA to the pixel unit 101 according to an instruction of a control circuit; and the scan driving circuit 103 is configured to supply a signal such as the light-emitting control signal EM, the scan signal SCAN and the reset control signal RESET to the pixel unit 101 according to an instruction of a control circuit. For example, the control circuit includes an external integrated circuit (IC), without limited thereto. For example, the scan driving circuit 103 is a Gate On Array (GOA) structure mounted on the display panel, or a driver chip (IC) structure that is bonded to the display panel. For example, different driving circuits may also be used to supply the light-emitting control signal EM and the scan signal SCAN, respectively. For example, the display panel 100 further includes a power source (not illustrated) to supply the above-described voltage signal, which may be a voltage source or a current source according to needs; the power source is configured to supply the first power voltage ELVDD, the second power voltage ELVSS, and the initialization signal Vint, etc., to the pixel unit 101 through the first power line 312, the second power line 14 and the initialization signal lines (the second initialization signal line 211 and the first initialization signal line 212), respectively.

For example, as illustrated in FIG. 2, a display substrate includes a display region R1 and a peripheral region R2. For example, the peripheral region R2 surrounds the display region R1, without limited thereto.

Figure 3A:
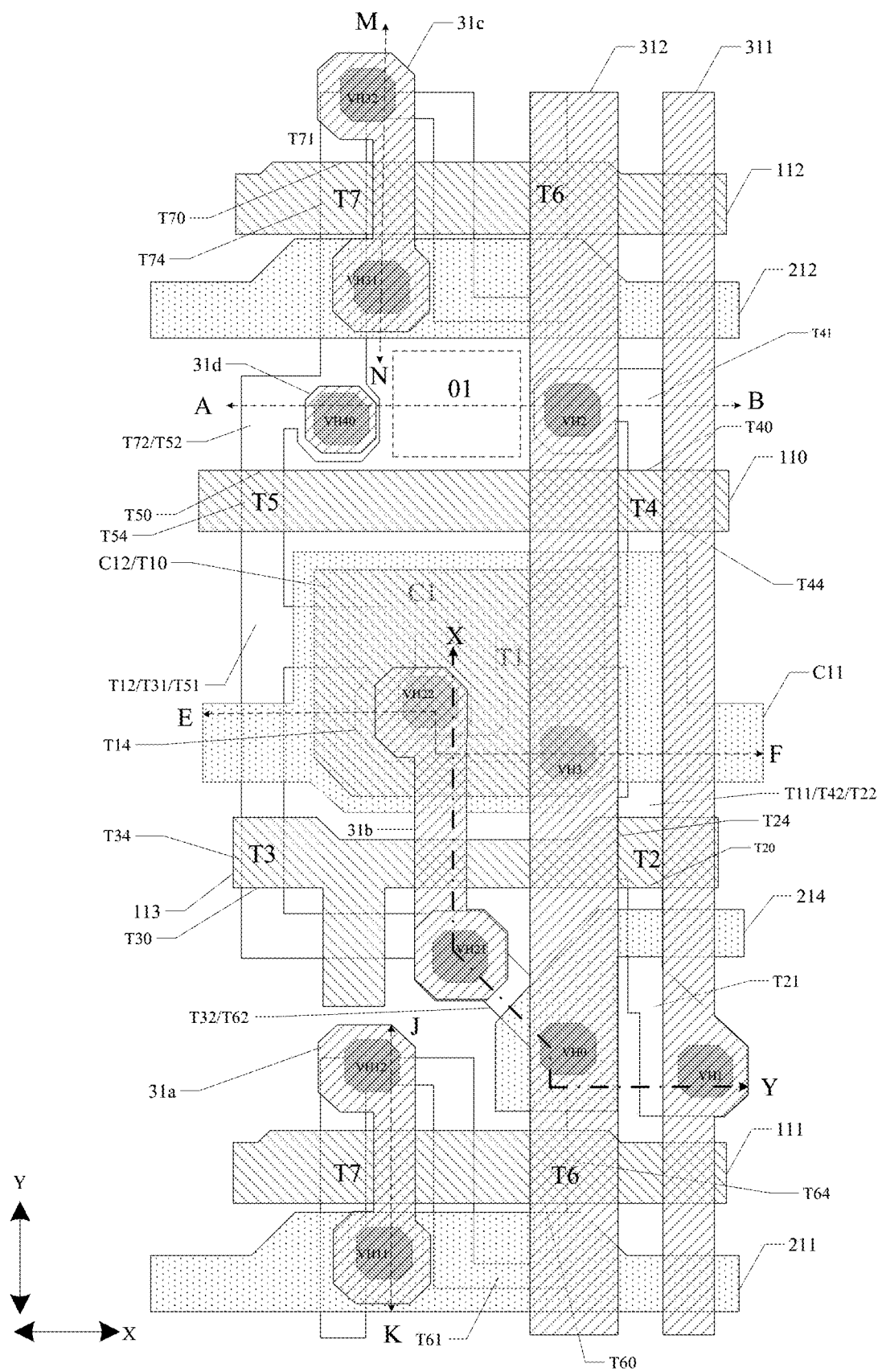
FIG. 3A is a partial plan view of a display substrate provided by an embodiment of the present disclosure.

FIG. 3A is a partial plan view of a display substrate provided by an embodiment of the present disclosure. As illustrated in FIG. 1 and FIG. 3A, the display substrate includes: a pixel circuit structure 10 and a light transmission hole 01. The pixel circuit structure 10 includes a first light-emitting control transistor T4 and a second light-emitting control transistor T5. As illustrated in FIG. 3A, the light transmission hole 01 is located between the first light-emitting control transistor T4 and the second light-emitting control transistor T5.

In the display substrate provided by an embodiment of the present disclosure, a more reasonable placement solution of the light transmission hole 01 (imaging pinhole) is obtained by overall optimization and adjustment of a pattern within a pixel unit while providing a process margin and a function of the pixel circuit structure.

For example, as illustrated in FIG. 1 and FIG. 3A, the display substrate further includes a light-emitting control signal line 110; and a gate electrode T40 of the first light-emitting control transistor T4 and a gate electrode T50 of the second light-emitting control transistor T5 are both connected with the light-emitting control signal line 110. For example, as illustrated in FIG. 3A, a portion of the light-emitting control signal line 110 serves as the gate electrode T40 of the first light-emitting control transistor T4. For example, as illustrated in FIG. 3A, a portion of the light-emitting control signal line 110 serves as the gate electrode T50 of the second light-emitting control transistor T5. As illustrated in FIG. 3A, the light-emitting control signal line 110 extends in a first direction X. Because the light transmission hole 01 is located between the first light-emitting control transistor T4 and the second light-emitting control transistor T5, a position of the light transmission hole in the first direction X is determined.

For example, as illustrated in FIG. 3A, the first light-emitting control transistor T4, the light transmission hole 01, and the second light-emitting control transistor T5 are arranged in the first direction X. For example, a first electrode T41 of the first light-emitting control transistor T4 and a second electrode T52 of the second light-emitting control transistor T5 are located at the same side of the light-emitting control signal line 110; and a connection line of a center of the first electrode T41 of the first light-emitting control transistor T4 and a center of the second electrode T52 of the second light-emitting control transistor T5 passes through the light transmission hole 01. In the embodiment of the present disclosure, a center of a certain element may refer to a center of a geometric shape thereof, or a center of a certain element may refer to a center of gravity of a geometric shape thereof, without limited thereto. The connection line of the center of the first electrode T41 of the first light-emitting control transistor T4 and the center of the second electrode T52 of the second light-emitting control transistor T5 is a virtual line.

For example, as illustrated in FIG. 3A, the light transmission hole 01 is located at a first side of the light-emitting control signal line 110. The first electrode T41 of the first light-emitting control transistor T4 and the second electrode T52 of the second light-emitting control transistor T5 are also located at the first side of the light-emitting control signal line 110.

For example, as illustrated in FIG. 1 and FIG. 3A, the display substrate further includes a first power line 312 and a light-emitting element 20. As illustrated in FIG. 3A, the pixel circuit structure 10 further includes a driving transistor T1 located at a second side of the light-emitting control signal line 110. The first side and the second side are opposite sides of the light-emitting control signal line 110. As illustrated in FIG. 3A, the first side is an upper side of the light-emitting control signal line 110 and the second side is a lower side of the light-emitting control signal line 110. The first electrode T41 and a second electrode T42 of the first light-emitting control transistor T4 are electrically connected with the first power line 312 and a first electrode T11 of the driving transistor T1, respectively. A first electrode T51 and the second electrode T52 of the second light-emitting control transistor T5 are electrically connected with a second electrode T12 of the driving transistor T1 and a first electrode 201 (not illustrated in FIG. 3A, please refer to FIG. 1) of the light-emitting element 20, respectively.

For example, as illustrated in FIG. 3A, the first power line 312 extends in a second direction Y; and the second direction Y intersects with the first direction X. For example, the second direction Y is perpendicular to the first direction X, without limited thereto.

For example, as illustrated in FIG. 3A, the display substrate further includes a first initialization signal line 212, a second initialization signal line 211, a first reset control signal line 111, and a second reset control signal line 112; and the pixel circuit structure 10 further includes a first reset transistor T6 and a second reset transistor T7. A gate electrode T60 of the first reset transistor T6 is electrically connected with the first reset control signal line 111; a first electrode T61 of the first reset transistor T6 is electrically connected with the second initialization signal line 211 through a first connection electrode 31a; and a second electrode T62 of the first reset transistor T6 is electrically connected with a gate electrode T10 of the driving transistor T1 through a second connection electrode 31b. A gate electrode T70 of the second reset transistor T7 is electrically connected with the second reset control signal line 112; a first electrode T71 of the second reset transistor T7 is electrically connected with the first initialization signal line 212 through a third connection electrode 31c; and a second electrode T72 of the second reset transistor T7 is electrically connected with the first electrode 201 (referring to FIG. 1) of the light-emitting element 20.

As illustrated in FIG. 1 and FIG. 3A, the gate electrode T40 of the first light-emitting control transistor T4 is electrically connected with the light-emitting control signal line 110; and the first electrode T41 and the second electrode T42 of the first light-emitting control transistor T4 are electrically connected with the first power line 312 and the first electrode T11 of the driving transistor T1, respectively. The gate electrode T50 of the second light-emitting control transistor T5 is electrically connected with the light-emitting control signal line 110; and the first electrode T51 and the second electrode T52 of the second light-emitting control transistor T5 are electrically connected with the second electrode T12 of the driving transistor T1 and the first electrode 201 (referring to FIG. 1) of the light-emitting element 20, respectively. The second electrode (which may be a common electrode of the OLED, such as a cathode) of the light-emitting element 20 is electrically connected with a second power line 14.

It should be explained that, transistors used in the embodiment of the present disclosure may be thin film transistors, field effect transistors or other switching devices with the like characteristics. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as required. For example, the first electrode of the transistor described in the embodiment of the present disclosure may be the source electrode, and the second electrode may be the drain electrode; alternatively, the first electrode of the transistor may be the drain electrode, and the second electrode may be the source electrode.

In addition, the transistors may be classified into N-type transistors and P-type transistors according to the characteristics of the transistors. The embodiments of the present disclosure illustrate the technical solution of the present disclosure in detail by taking the transistors as P-type transistors as an example. Based on the description and teaching of the implementations of the present disclosure, one of ordinary skill in the art can easily think of an implementation in which at least some of the transistors in the pixel circuit structure of the embodiment of the present disclosure adopt N-type transistors, that is, an implementation of using a transistor of N-type or a combination of a transistor of N-type and a P-type transistor, without any inventive work, therefore, these implementations are also within the scope of the present disclosure.

For example, as illustrated in FIG. 3A, the second initialization signal line 211 extends in the first direction X; the first initialization signal line 212 extends in the first direction X; the first reset control signal line 111 extends in the first direction X; and the second reset control signal line 112 extends in the first direction X.

For example, as illustrated in FIG. 3A, the light transmission hole 01 is further located between the driving transistor T1 and the second reset transistor T7. Thus, the position of the light transmission hole in the second direction Y is determined.

For example, the driving transistor T1 and the second reset transistor T7 are arranged at two sides of the light transmission hole 01 that are opposite to each other in the second direction Y, respectively. For example, the two sides of the light transmission hole 01 in the second direction Y are provided with the driving transistor T1 and the second reset transistor T7, respectively.

For example, the light transmission hole 01 is further located between the first initialization signal line 212 and the light-emitting control signal line 110, so that the position of the light transmission hole in the second direction Y is determined.

For example, as illustrated in FIG. 3A, the second reset control signal line 112, the first initialization signal line 212, the light-emitting control signal line 110, the first reset control signal line 111, and the second initialization signal line 211 are sequentially arranged in the second direction Y.

As illustrated in FIG. 1 and FIG. 3A, the display substrate further includes a gate line 113, a data line 311, and the second power line 14 (as illustrated in FIG. 1); and the pixel circuit structure 10 further includes a storage capacitor C1, a data writing transistor T2, and a threshold compensation transistor T3. A first electrode C11 of the storage capacitor C1 is electrically connected with the first power line 312; and a second electrode C12 of the storage capacitor C1 is electrically connected with a second electrode T32 of the threshold compensation transistor T3 through the second connection electrode 31b. A gate electrode T20 of the data writing transistor T2 is electrically connected with the gate line 113; and a first electrode T21 and a second electrode T22 of the data writing transistor T2 are electrically connected with the data line 311, and the first electrode T11 of the driving transistor T1, respectively. A gate electrode T30 of the threshold compensation transistor T3 is electrically connected with the gate line 113; a first electrode T31 of the threshold compensation transistor T3 is electrically connected with the second electrode T12 of the driving transistor T1; a second electrode T32 of the threshold compensation transistor T3 is electrically connected with the gate electrode T10 of the driving transistor T1 through the second connection electrode 31b; and the second electrode 202 (referring to FIG. 1) of the light-emitting element 20 is electrically connected with the second power line 14 (illustrated in FIG. 1).

For example, as illustrated in FIG. 3A, in order to facilitate forming the light transmission hole 01, an edge of the first power line 312 that is close to the data line 311 has an equal distance with respect to the data line 311 at various positions.

For example, as illustrated in FIG. 3A, the gate line 113 extends in the first direction X; and the gate line 113 is located between the light-emitting control signal line 110 and the first reset control signal line 111. For example, as illustrated in FIG. 3A, the gate line 113 is located between the storage capacitor C1 and the first reset control signal line 111.

For example, as illustrated in FIG. 3A, the data line 311 extends in the second direction Y; and the first power line 312 extends in the second direction Y.

For example, as illustrated in FIG. 3A, the first power line 312 is electrically connected with the first electrode T41 of the first light-emitting control transistor T4 through a via hole VH2. For example, as illustrated in FIG. 3A, the second connection electrode 31b is connected with the second electrode T32 of the threshold compensation transistor T3 through a via hole VH21; and the second connection electrode 31b is connected with the gate electrode T10 of the driving transistor T1 through a via hole VH22.

For example, as illustrated in FIG. 3A, a size of the light transmission hole 01 in the first direction X is in a range from 5 μm to 15 μm; and a size of the light transmission hole in the second direction Y is in a range from 5 μm to 15 μm. For example, a size of the pixel unit in the first direction X is about 30 μm. For example, a size of the pixel unit in the second direction Y is about 60 μm.

As illustrated in FIG. 3A, the display substrate further includes a fourth connection electrode 31d; and the fourth connection electrode 31d is electrically connected with the second electrode T52 of the second light-emitting control transistor T5. The fourth connection electrode 31d may be used to be electrically connected with the first electrode 201 (not illustrated in FIG. 3A, please refer to FIG. 1) of the light-emitting element 20 to be formed later.

In the embodiment of the present disclosure, as illustrated in FIG. 3A, the gate electrode T40 of the first light-emitting control transistor T4 is a portion of the light-emitting control signal line 110; the gate electrode T50 of the second light-emitting control transistor T5 is a portion of the light-emitting control signal line 110; the gate electrode T20 of the data writing transistor T2 is a portion of the gate line 113; the gate electrode T30 of the threshold compensation transistor T3 is a portion of the gate line 113; the gate electrode T60 of the first reset transistor T6 is a portion of the first reset control signal line 111; and the gate electrode T70 of the second reset transistor T7 is a portion of the second reset control signal line 112.

Figure 3B:
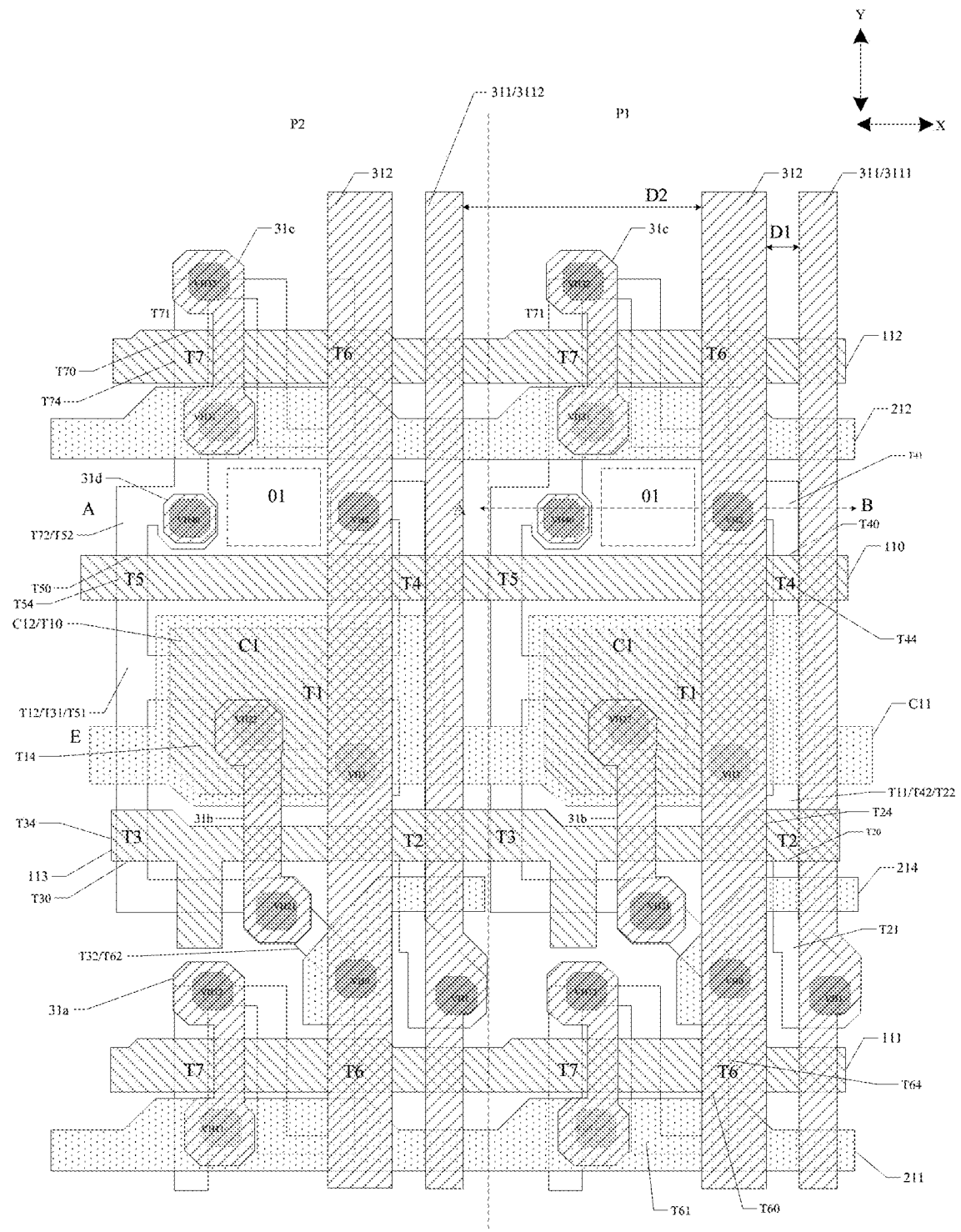
FIG. 3B is a partial plan view of a display substrate provided by an embodiment of the present disclosure.

FIG. 3B is a partial plan view of a display substrate provided by an embodiment of the present disclosure. The display substrate illustrated in FIG. 3B differs from the display substrate illustrated in FIG. 3A in that: FIG. 3B illustrates two pixel units, namely, a first pixel unit P1 and a second pixel unit P2. FIG. 3A illustrates only one pixel unit. For example, the first pixel unit P1 and the second pixel unit P2 have the same structure. The second pixel unit P2 and the first pixel unit P1 are adjacent to each other in the first direction.

As illustrated in FIG. 3B, the data line 311 includes a first data line 3111 and a second data line 3112. The first data line 3111 extends in a second direction Y; and the first data line 3111 is connected with the pixel circuit structure of the first pixel unit P1. The second data line 3112 extends in the second direction; and the second data line 3112 is connected with the pixel circuit structure of the second pixel unit P2; the first data line 3111 and the second data line 3112 are arranged at two sides of the first power line 312, respectively. As illustrated in FIG. 3B, a distance D1 between the first data line 3111 and the first power line 312 is less than a distance D2 between the second data line 3112 and the first power line 312.

Figure 5A:
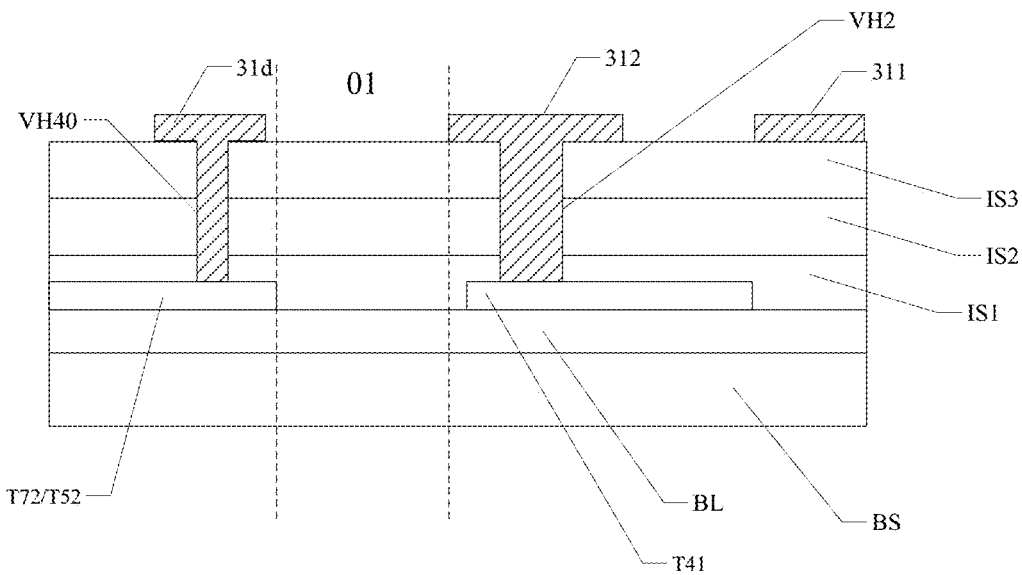
FIG. 5A is a cross-sectional view of FIG. 3A taken along line A-B.
Figure 5B:
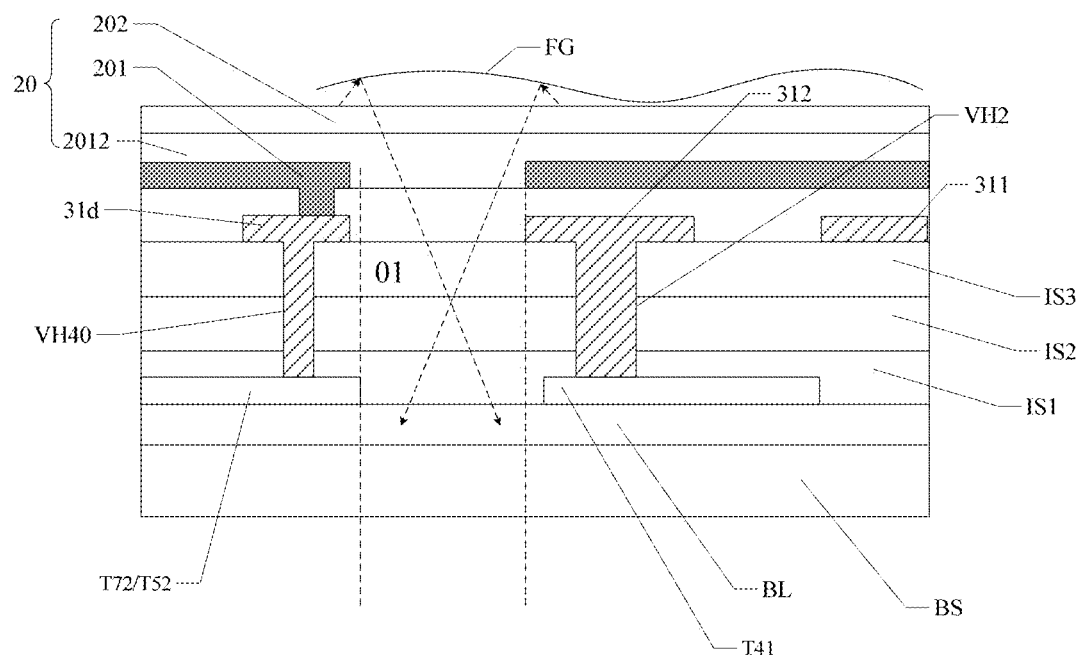
FIG. 5B is a cross-sectional view of the display substrate illustrated in FIG. 3A taken along line A-B provided by another embodiment of the present disclosure.

As illustrated in FIG. 3B and FIG. 5B, the light transmission hole 01 is located in a region enclosed by the first initialization signal line 212, the light-emitting control signal line 110, the first power line 312, and the second data line 3112. As illustrated in FIG. 3B and FIG. 5B, an orthographic projection of the light transmission hole 01 on a base substrate is not overlapped with an orthographic projection of the first electrode on the base substrate.

A manufacturing method of the display substrate illustrated in FIG. 3A or FIG. 3B is given below.

Figure 4A:
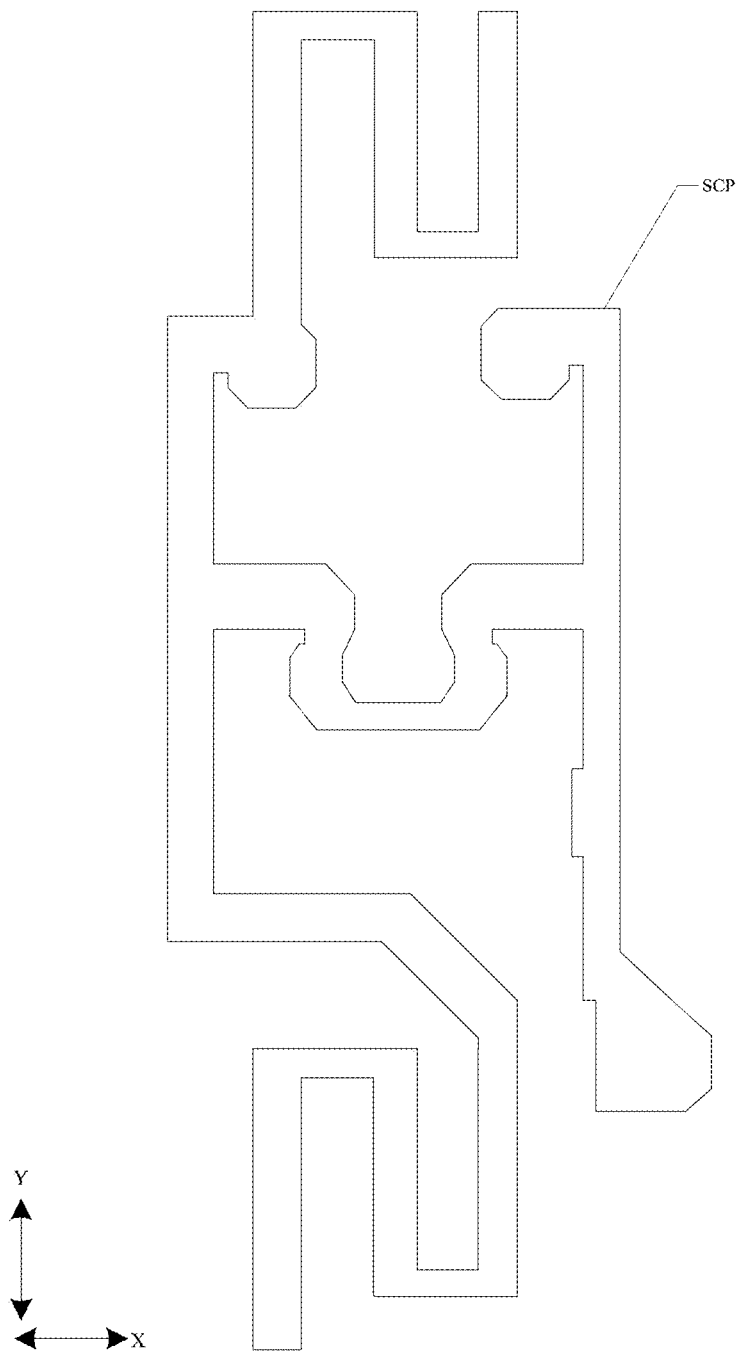
FIG. 4A is a schematic diagram of a semiconductor pattern layer formed in a manufacturing method of a display substrate provided by an embodiment of the present disclosure.

FIG. 4A is a schematic diagram of a semiconductor pattern layer formed in the manufacturing method of the display substrate provided by an embodiment of the present disclosure. The semiconductor pattern layer SCP is formed of a semiconductor material. The manufacturing method of the display substrate provided by an embodiment of the present disclosure further includes forming a first insulation thin film layer on the semiconductor pattern layer SCP.

Figure 4B:
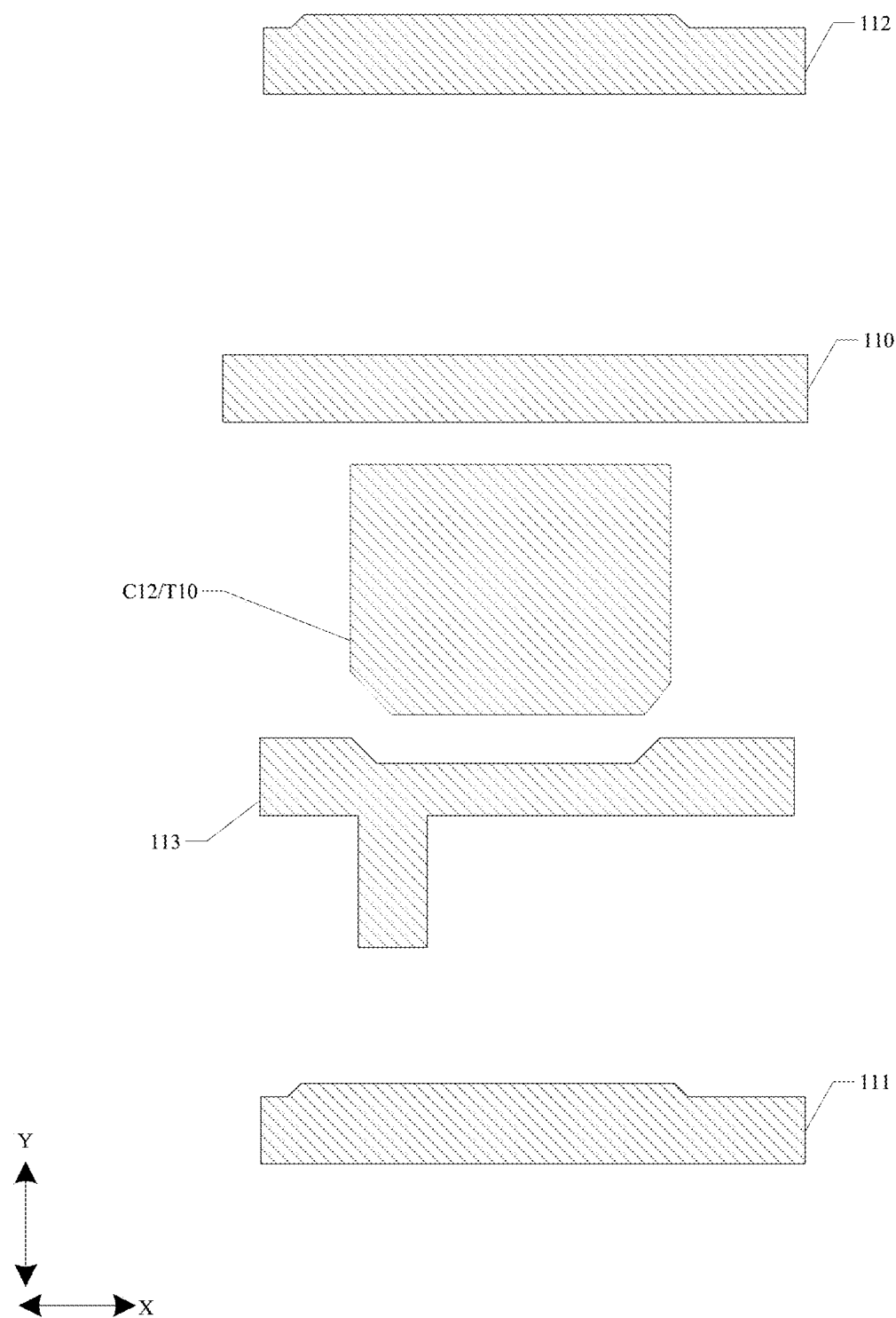
FIG. 4B is a schematic diagram of a first conductive pattern layer formed on a first insulation layer in a manufacturing method of a display substrate provided by an embodiment of the present disclosure.

FIG. 4B is a schematic diagram of a first conductive pattern layer formed on the first insulation thin film layer in the manufacturing method of the display substrate provided by an embodiment of the present disclosure. The first conductive pattern layer L1 includes a light-emitting control signal line 110, a first reset control signal line 111, a second reset control signal line 112, a gate line 113, and a gate electrode T10 of a driving transistor T1. The gate electrode T10 of the driving transistor T1 also serves as a second electrode C12 of a storage capacitor C1.

Figure 4C:
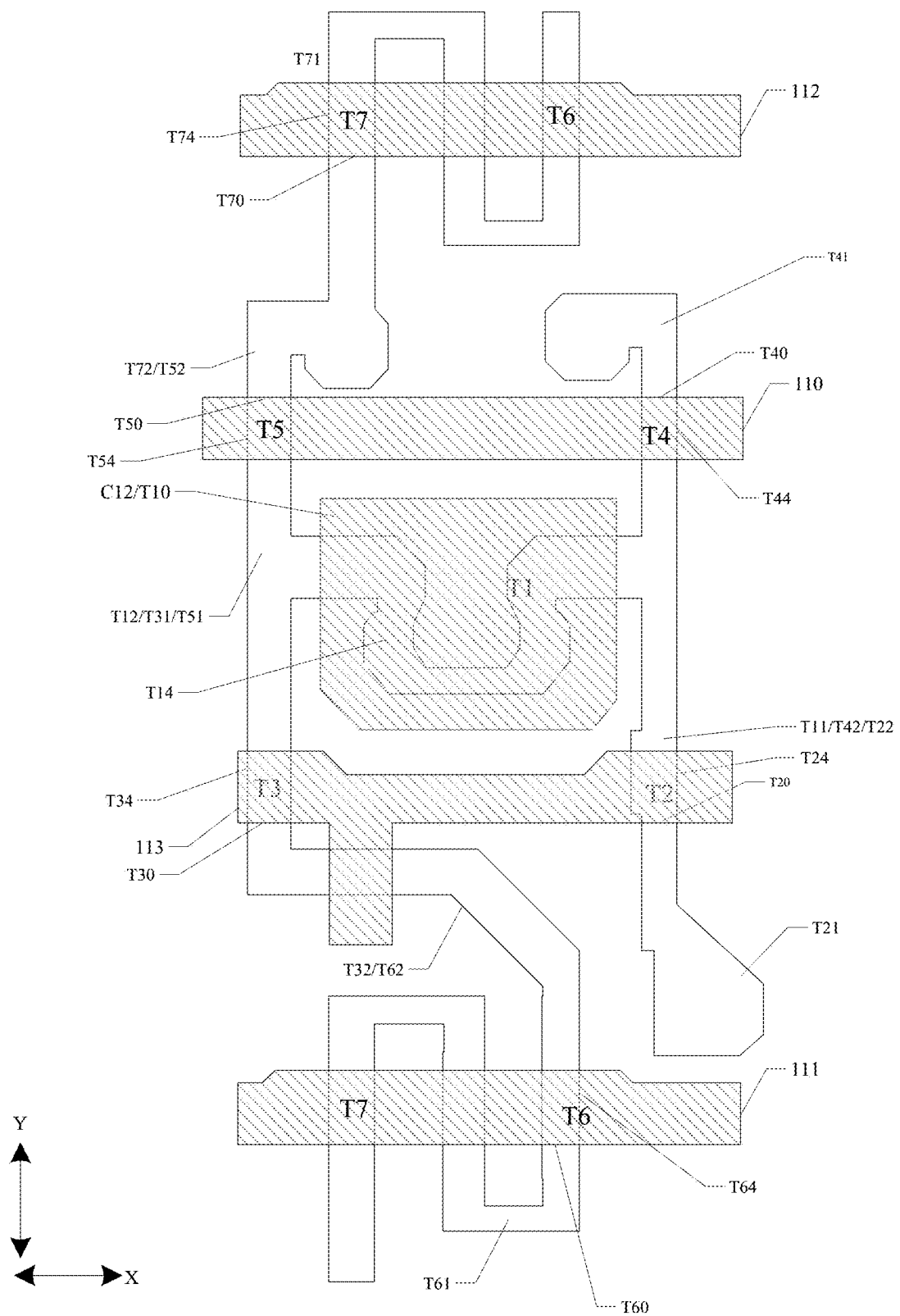
FIG. 4C is a schematic diagram of a structure obtained by performing a converting-into-conductor treatment on a semiconductor pattern layer by using a self-alignment process in a manufacturing method of a display substrate provided by an embodiment of the present disclosure.

FIG. 4C is a structural diagram after performing a converting-into-conductor treatment on the semiconductor pattern layer by a self-alignment process in the manufacturing method of the display substrate provided by an embodiment of the present disclosure. For example, in the fabrication process of the display substrate, performing the converting-into-conductor treatment on the semiconductor pattern layer SCP by a self-alignment process with the first conductive pattern layer L1 as a mask. For example, the semiconductor pattern layer SCP is heavily doped by ion implantation, so that a portion of the semiconductor pattern layer SCP that is not covered by the first conductive pattern layer L1 is made to be conductive, forming a source electrode region (a first electrode T11) and a drain electrode region (a second electrode T12) of the driving transistor T1, a source electrode region (a first electrode T21) and a drain electrode region (a second electrode T22) of a data writing transistor T2, a source electrode region (a first electrode T31) and a drain electrode region (a second electrode T32) of a threshold compensation transistor T3, a source electrode region (a first electrode T41) and a drain electrode region (a second electrode T42) of a first light-emitting control transistor T4, a source electrode region (a first electrode T51) and a drain electrode region (a second electrode T52) of a second light-emitting control transistor T5), a source electrode region (a first electrode T61) and a drain electrode region (a second electrode T62) of a first reset transistor T6, as well as a source electrode region (a first electrode T71) and a drain electrode region (a second electrode T72) of a second reset transistor T7. A portion of the semiconductor pattern layer SCP that is covered by the first conductive pattern layer L1 retains semiconductor characteristics, forming a channel region T14 of the driving transistor T1, a channel region T24 of the data writing transistor T2, a channel region T34 of the threshold compensation transistor T3, a channel region T44 of the first light-emitting control transistor T4, a channel region TM of the second light-emitting control transistor T5, a channel region T64 of the first reset transistor T6, and a channel region T74 of the second reset transistor T7. For example, as illustrated in FIG. 4C, the second electrode T72 of the second reset transistor T7 and the second electrode T52 of the second light-emitting control transistor T5 are integrally formed; the first electrode T51 of the second light-emitting control transistor T5, the second electrode T12 of the driving transistor T1, and the first electrode T31 of the threshold compensation transistor T3 are integrally formed; the first electrode T11 of the driving transistor T1, the second electrode T22 of the data writing transistor T2, and the second electrode T42 of the first light-emitting control transistor T4 are integrally formed; and the second electrode T32 of the threshold compensation transistor T3 and the second electrode T62 of the first reset transistor T6 are integrally formed. In some embodiments, as illustrated in FIG. 4C, the first electrode T71 of the second reset transistor T7 and the first electrode T61 of the first reset transistor T6 may be integrally formed.

For example, the channel regions (active layers) of the transistors used in the embodiment of the present disclosure may be made of monocrystalline silicon, polycrystalline silicon (e.g., low temperature polycrystalline silicon), or metal oxide semiconductor materials (e.g., IGZO, AZO, etc.). In one embodiment, the transistors are all Low Temperature Polycrystalline silicon (LTPS) thin-film transistors of P-type. In another embodiment, the threshold compensation transistor T3 and the first reset transistor T6 that are directly connected with the gate electrode of the driving transistor T1 are metal oxide semiconductor thin-film transistors, that is, channel materials of the transistors are metal oxide semiconductor materials (e.g., IGZO, AZO, etc.); and the metal oxide semiconductor thin-film transistor has a relatively low leakage current, which can help to reduce a gate electrode leakage current of the driving transistor T1.

For example, the transistors used in the embodiment of the present disclosure may include various structures, such as a top gate type, a bottom gate type, or a double-gate structure. In one embodiment, the threshold compensation transistor T3 and the first reset transistor T6 that are directly connected with the gate electrode of the driving transistor T1 are thin-film transistors of a double-gate structure, which may help to reduce a gate electrode leakage current of the driving transistor T1.

In the manufacturing method of the display substrate provided by an embodiment of the present disclosure, forming a second insulation thin film layer on the structure obtained after performing the converting-into-conductor treatment. The second insulation thin film layer is not illustrated in the diagram. For example, the second insulation thin film layer may have a planar shape covering the base substrate.

Figure 4D:
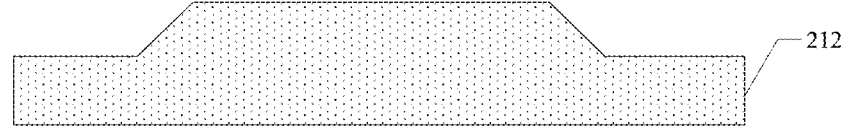
FIG. 4D is a schematic diagram of a second conductive pattern layer formed on a second insulation thin film inter layer in the manufacturing method of the display substrate provided by an embodiment of the present disclosure.
Figure 4D:
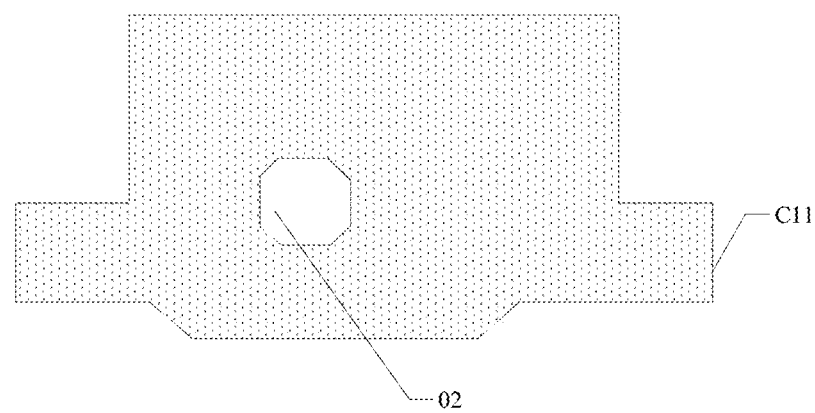
Figure 4D:
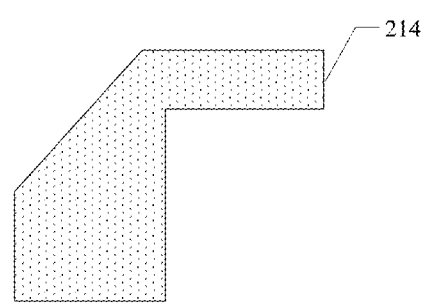
Figure 4D:
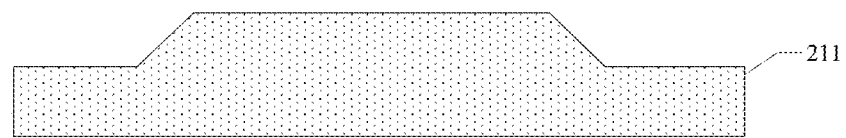
Figure 4D:
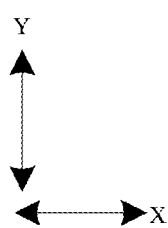

FIG. 4D is a schematic diagram of a second conductive pattern layer formed on the second insulation thin film layer in the manufacturing method of the display substrate provided by an embodiment of the present disclosure. The second conductive pattern layer L2 includes a first initialization signal line 212, a first electrode C11 of the storage capacitor C1, a second initialization signal line 211, and a connection element 214. The first electrode C11 of the storage capacitor C1 has an opening 02 to facilitate a second connection electrode 31b to be electrically connected with the second electrode C12 of the storage capacitor C1 through the opening 02. The second connection electrode 31b and the first electrode C11 of the storage capacitor C1 are insulated from each other.

Figure 4E:
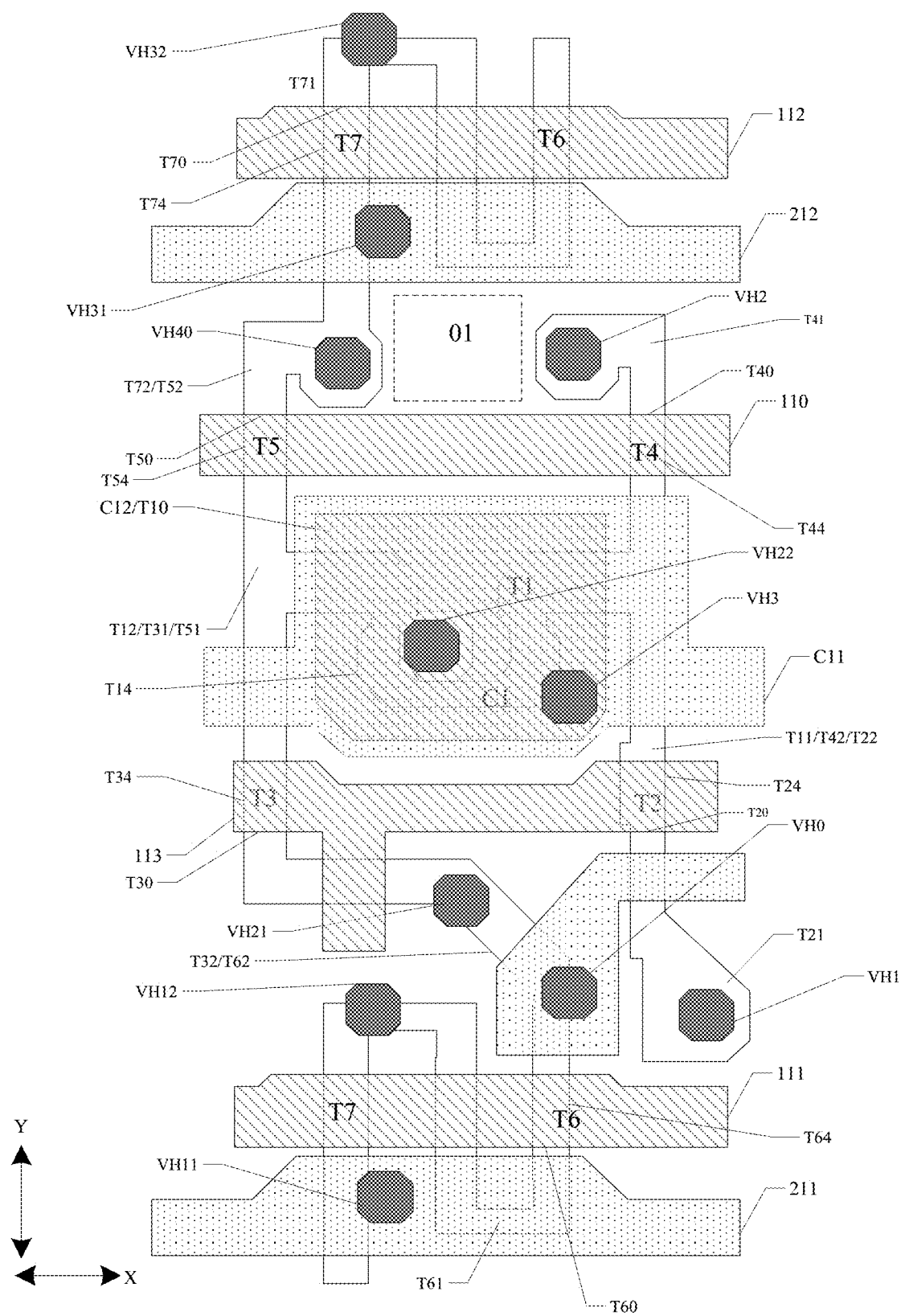
FIG. 4E is a schematic diagram of forming a third insulation thin film layer on a second conductive pattern layer and forming a via hole in the third insulation thin film layer in a manufacturing method of a display substrate provided by an embodiment of the present disclosure.

FIG. 4E is a schematic diagram of forming a third insulation thin film layer on the second conductive pattern layer and forming a via hole in at least one of the first insulation thin film layer, the second insulation thin film layer, and the third insulation thin film layer in the manufacturing method of the display substrate provided by an embodiment of the present disclosure. As illustrated in FIG. 4E, forming a first insulation layer, a second insulation layer, and a third insulation layer upon forming the via hole. FIG. 4E does not illustrate the first insulation layer, the second insulation layer, and the third insulation layer, for which a subsequent cross-sectional view may be referred to. The third insulation thin film layer may have a planar shape covering the base substrate. The first insulation layer is a structure after forming a via hole in the first insulation thin film layer. The second insulation layer is a structure after forming a via hole in the second insulation thin film layer. The third insulation layer is a structure after forming a via hole in the third insulation thin film layer. As illustrated in FIG. 4E, the third insulation layer includes a via hole VH40, a via hole VH0, a via hole VH1, a via hole VH2, a via hole VH3, a via hole VH11, a via hole VH12, a via hole VH21, a via hole VH22, a via hole VH31, and a via hole VH32.

Figure 4F:
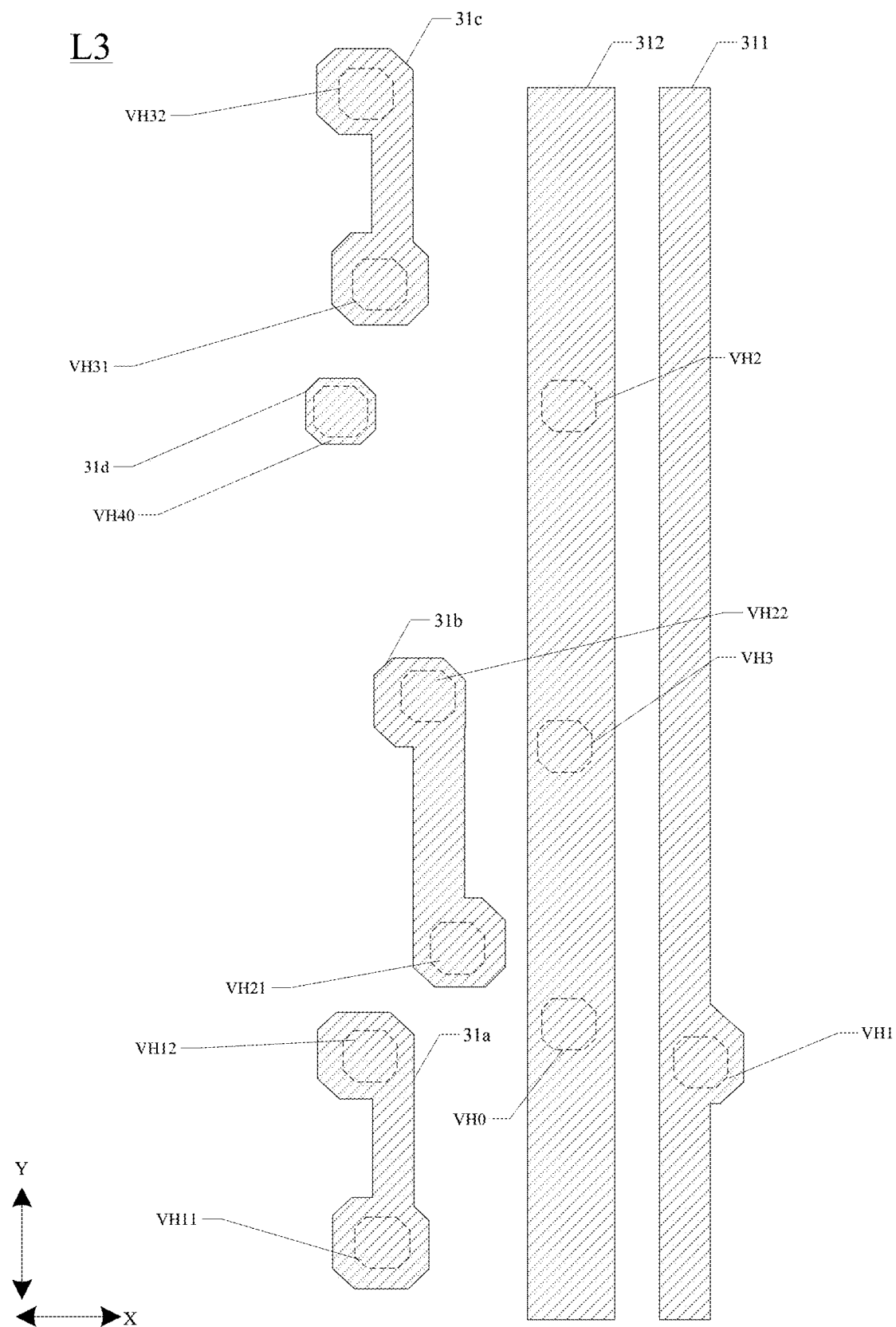
FIG. 4F is a schematic diagram of a third conductive pattern layer formed on a third insulation layer in a manufacturing method of a display substrate provided by an embodiment of the present disclosure.

FIG. 4F is a schematic diagram of a third conductive pattern layer formed on the third insulation layer in the manufacturing method of the display substrate provided by an embodiment of the present disclosure. As illustrated in FIG. 4F, the third conductive pattern layer L3 includes a first connection electrode 31a, a second connection electrode 31b, a third connection electrode 31c, a fourth connection electrode 31d, a data line 311, and a first power line 312. Dotted borders in FIG. 4F respectively refer to positions corresponding to the via hole VH40, the via hole VH0, the via hole VH1, the via hole VH2, the via hole VH3, the via hole VH11, the via hole VH12, the via hole VH21, the via hole VH22, the via hole VH31 and the via hole VH32. For example, as illustrated in FIG. 4F, the first connection electrode 31a, the second connection electrode 31b, the third connection electrode 31c, the fourth connection electrode 31d, the data line 311, and the first power line 312 are located in the same layer. Thus, the data line 311 is electrically connected with the first electrode T21 of the data writing transistor T2 through the via hole VH1; the first power line 312 is electrically connected with the first electrode T41 of the first light-emitting control transistor T4 through the via hole VH2; the first power line 312 is electrically connected with the first electrode C11 of the storage capacitor C1 through the via hole VH3; the first power line 312 is electrically connected with the connection element 214 through the via hole VH0; and the connection element 214 is connected in parallel with the first power line 312, which, thus, may function to reduce a resistance. One end of the first connection electrode 31a is electrically connected with the second initialization signal line 211 through the via hole VH11, and the other end of the first connection electrode 31a is connected with the first electrode T61 of the first reset transistor T6 through the via hole VH12, so that the first electrode T61 of the first reset transistor T6 is electrically connected with the second initialization signal line 211. One end of the second connection electrode 31b is electrically connected with the second electrode T62 of the first reset transistor T6 through the via hole VH21, and the other end of the second connection electrode 31b is electrically connected with the gate electrode T10 (i.e., the second electrode C12 of the storage capacitor C1) of the driving transistor T1 through the via hole VH22, so that the second electrode T62 of the first reset transistor T6 is electrically connected with the gate electrode T10 (i.e., the second electrode C12 of the storage capacitor C1) of the driving transistor T1. One end of the third connection electrode 31c is electrically connected with the first initialization signal line 212 through the via hole VH31, and the other end of the third connection electrode 31c is electrically connected with the first electrode T71 of the second reset transistor T7 through the via hole VH32, so that the first electrode T71 of the second reset transistor T7 is electrically connected with the first initialization signal line 212. The display substrate illustrated in FIG. 3A or FIG. 3B can be obtained upon forming the third conductive pattern layer.

For example, in FIG. 3A, the second reset transistor T7 in an upper left corner, the first reset transistor T6 in a lower right corner, the driving transistor T1, the data writing transistor T2, the threshold compensation transistor T3, the first light-emitting control transistor T4, and the second light-emitting control transistor T5 constitute 7 transistors illustrated in FIG. 1, that is, constitute 7 transistors in a pixel circuit structure within one pixel unit.

For example, the first conductive pattern layer L1, the second conductive pattern layer L2, and the third conductive pattern layer L3 are all made of metal materials. For example, the first conductive pattern layer L1 is formed of the same metal material by the same patterning process, the second conductive pattern layer L2 is formed of the same metal material by the same patterning process, and the third conductive pattern layer L3 is formed of the same metal material by the same patterning process. For example, the metal material includes aluminum metal or titanium metal, without limited thereto. For example, the first conductive pattern layer L1, the second conductive pattern layer L2, and the third conductive pattern layer L3 may adopt a three-layer metal structure of titanium-aluminum-titanium, without limited thereto.

FIG. 5A is a cross-sectional view of FIG. 3A taken along line A-B. As illustrated in FIG. 5A, a buffer layer BL is disposed on a base substrate BS; the second electrode T52 of the second light-emitting control transistor T5 and the first electrode T41 of the first light-emitting control transistor T4 are disposed on the buffer layer BL; a first insulation layer IS1, a second insulation layer IS2, and a third insulation layer IS3 are disposed on the second electrode T52 of the light-emitting control transistor T5 and the first electrode T41 of the first light-emitting control transistor T4. The via hole VH2 is formed in the first insulation layer IS1, the second insulation layer IS2, and the third insulation layer IS3; and the first power line 312 is electrically connected with the first electrode T41 of the first light-emitting control transistor T4 through the via hole VH2. The data line 311 is further disposed on the third insulation layer IS3. The fourth connection electrode 31d is further disposed on the third insulation layer IS3. As illustrated in FIG. 3A and FIG. 5A, the fourth connection electrode 31*d* is electrically connected with the second electrode T52 of the second light-emitting control transistor T5 through the via hole VH40.

FIG. 5B is a cross-sectional view of the display substrate illustrated in FIG. 3A taken along line A-B provided by another embodiment of the present disclosure. As compared with the embodiment illustrated in FIG. 5A, the embodiment illustrated in FIG. 5B illustrates the first electrode 201, the second electrode 202, and an organic layer 2012 located between the first electrode 201 and the second electrode 202. For example, the organic layer 2012 includes a light-emitting layer. For example, the organic layer 2012 further includes at least one selected from the group consisting of a hole injection layer, a hole transport layer, an electron transport layer, and an electron injection layer, without limited thereto. For example, the first electrode 201, the second electrode 202, and the organic layer 2012 constitute the light-emitting element 20. Light emitted from the light-emitting element 20 is reflected by a finger FG, then passes through the light transmission hole 01, and may reach the sensor, thereby realizing a fingerprint identification function. The finger FG includes ridges and valleys. For example, the sensor may be located between the base substrate and the thin-film transistor. For example, the sensor may also be located at a side of the base substrate away from the thin-film transistor.

For example, the first electrode 201 is an anode of the light-emitting element 20; and the second electrode 202 is a cathode of the light-emitting element 20. For example, the first electrode 201 may be made of a transparent conductive material and a metal material; and the second electrode 202 may be made of a transparent or semi-transparent conductive material. In some embodiments, the first electrode 201 may be made of at least one selected from the group consisting of transparent conductive metal oxide and silver, without limited thereto. For example, the transparent conductive metal oxide includes Indium Tin Oxide (ITO), without limited thereto. For example, the first electrode 201 may adopt a structure in which three sub-layers of ITO-Ag-ITO are stacked. In some embodiments, the second electrode may be a metal with a low work function, which may be at least one selected from the group consisting of magnesium and silver, without limited thereto. For example, in other embodiments, the material of the second electrode includes a magnesium aluminum alloy (MgAl), a lithium aluminum alloy (LiAl), or metals such as magnesium, aluminum, lithium, etc. For example, in some embodiments of the present disclosure, in order to prevent stray light from affecting fingerprint identification, the first electrode 201 is an opaque electrode, without limited thereto.

As illustrated in FIG. 5B, the first electrode 201 is hollowed out (has an opening) in a position corresponding to the light transmission hole 01. For example, as illustrated in FIG. 5B, an orthographic projection of the light transmission hole 01 on the base substrate BS is not overlapped with an orthographic projection of the first electrode 201 on the base substrate BS.

Figure 6:
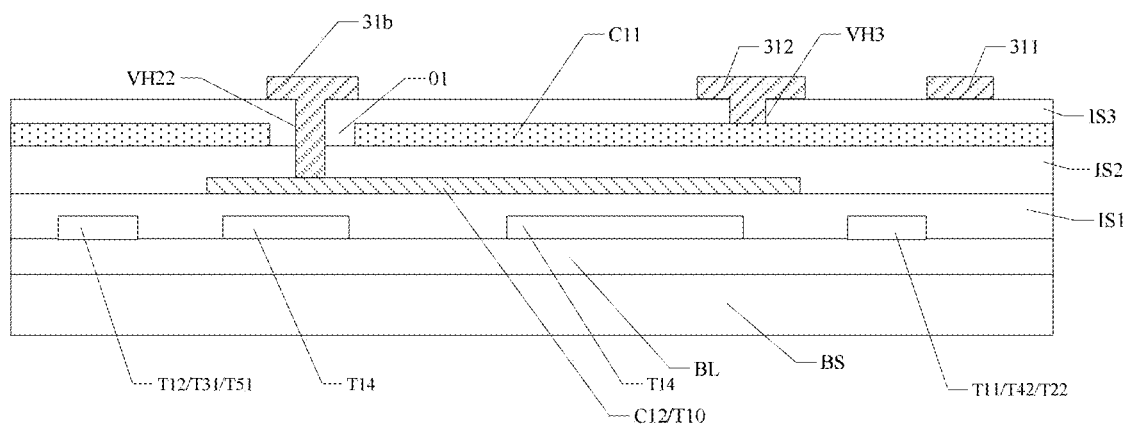
FIG. 6 is a cross-sectional view of FIG. 3A taken along line E-F.

FIG. 6 is a cross-sectional view of FIG. 3A taken along line E-F. As illustrated in FIG. 6, a buffer layer BL is disposed on a base substrate BS; the channel region T14 of the driving transistor T1, the first electrode T11 of the driving transistor T1, and the second electrode T12 of the driving transistor T1 are disposed on the buffer layer BL; a first insulation layer IS1 is disposed on the channel region T14 of the driving transistor T1, the first electrode T11 of the driving transistor T1, and the second electrode T12 of the driving transistor T1; the second electrode C12 (i.e., the gate electrode T10 of the driving transistor T1) of the storage capacitor C1 is disposed on the first insulation layer IS1; a second insulation layer IS2 is disposed on the second electrode C12 of the storage capacitor C1; the first electrode C11 of the storage capacitor C1 is disposed on the second insulation layer IS2; a third insulation layer IS3 is disposed on the first electrode C11 of the storage capacitor C1. The second connection electrode 31*b*, the first power line 312, and the data line 311 are disposed on the third insulation layer IS3. The via hole VH22 is provided in the second insulation layer IS2 and the third insulation layer IS3; and the second connection electrode 31*b* is electrically connected with the second electrode C12 of the storage capacitor C1 through the via hole VH22. The second connection electrode 31*b* and the first electrode C11 of the storage capacitor C1 are insulated from each other; and the second electrode C12 of the storage capacitor C1 and the first electrode C11 of the storage capacitor C1 are insulated from each other. The via hole VH3 is provided in the third insulation layer IS3; and the first power line 312 is electrically connected with the first electrode C11 of the storage capacitor C1 through the via hole VH3. For example, the base substrate BS is a transparent substrate. The first insulation layer IS1, the second insulation layer IS2, and the third insulation layer IS3 are made of insulation materials. The insulation materials include inorganic insulation materials and organic insulation materials. The inorganic insulation materials include silicon oxide, silicon nitride, and silicon oxynitride, without limited thereto; and the organic insulation materials include polyimide (PI), without limited thereto.

Figure 7A:
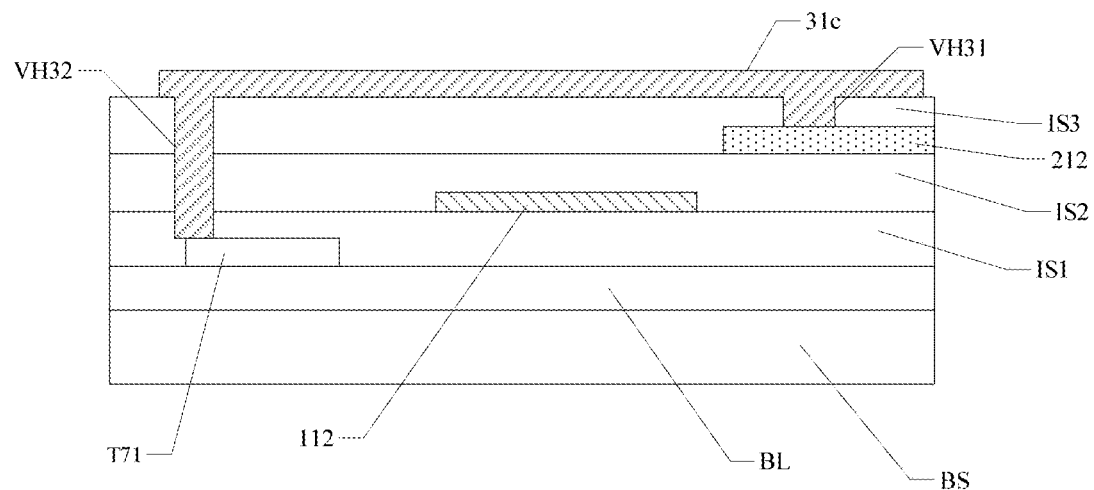
FIG. 7A is a cross-sectional view of FIG. 3A taken along line M-N.

FIG. 7A is a cross-sectional view of FIG. 3A taken along line M-N. As illustrated in FIG. 7A, a buffer layer BL is disposed on a base substrate BS; the first electrode T71 of the second reset transistor T7 is disposed on the buffer layer BL; a first insulation layer IS1 is disposed on the first electrode T71 of the second reset transistor T7; a second reset control signal line 112 is disposed on the first insulation layer IS1; a second insulation layer IS2 is disposed on the second reset control signal line 112; the first initialization signal line 212 is disposed on the second insulation layer IS2; and a third insulation layer IS3 is disposed on the first initialization signal line 212. The via hole VH32 is provided in the first insulation layer IS1, the second insulation layer IS2, and the third insulation layer IS3; the via hole VH31 is provided in the third insulation layer IS3; and the third connection electrode 31*c* is electrically connected with the first electrode T71 of the second reset transistor T7 through the via hole VH32. The third connection electrode 31*c* is electrically connected with the first initialization signal line 212 through the via hole VH31.

Figure 7B:
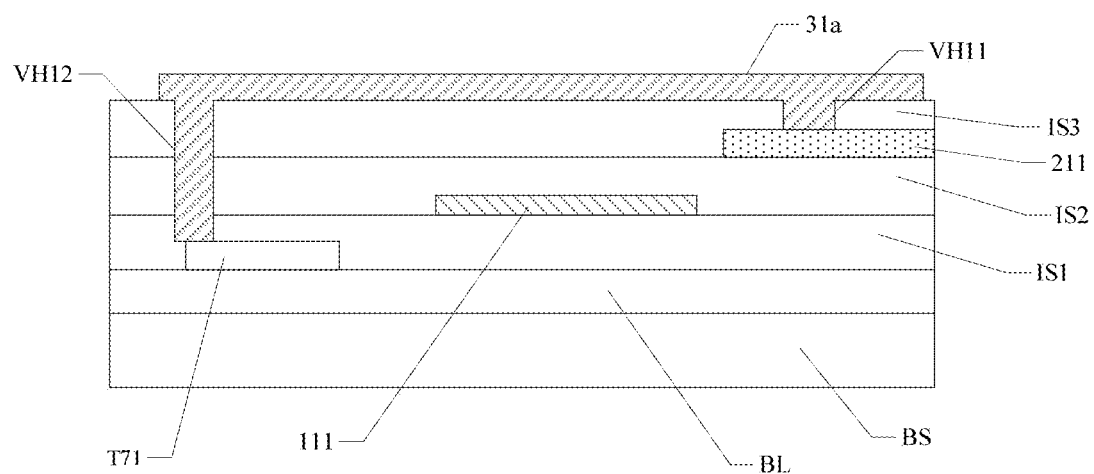
FIG. 7B is a cross-sectional view of FIG. 3A taken along line J-K.

FIG. 7B is a cross-sectional view of FIG. 3A taken along line J-K. As illustrated in FIG. 7B, a buffer layer BL is disposed on a base substrate BS; the first electrode T71 of the second reset transistor T7 is disposed on the buffer layer BL; a first insulation layer IS1 is disposed on the first electrode T71 of the second reset transistor T7; the first reset control signal line 111 is disposed on the first insulation layer IS1; a second insulation layer IS2 is disposed on the first reset control signal line 111; the second initialization signal line 211 is disposed on the second insulation layer IS2; and a third insulation layer IS3 is disposed on the second initialization signal line 211. The via hole VH12 is provided in the first insulation layer IS1, the second insulation layer IS2, and the third insulation layer IS3; the via hole VH11 is provided in the third insulation layer IS3; and the first connection electrode 31a is electrically connected with the first electrode T71 of the second reset transistor T7 through the via hole VH12. The first connection electrode 31a is electrically connected with the second initialization signal line 211 through the via hole VH11.

Figure 7C:
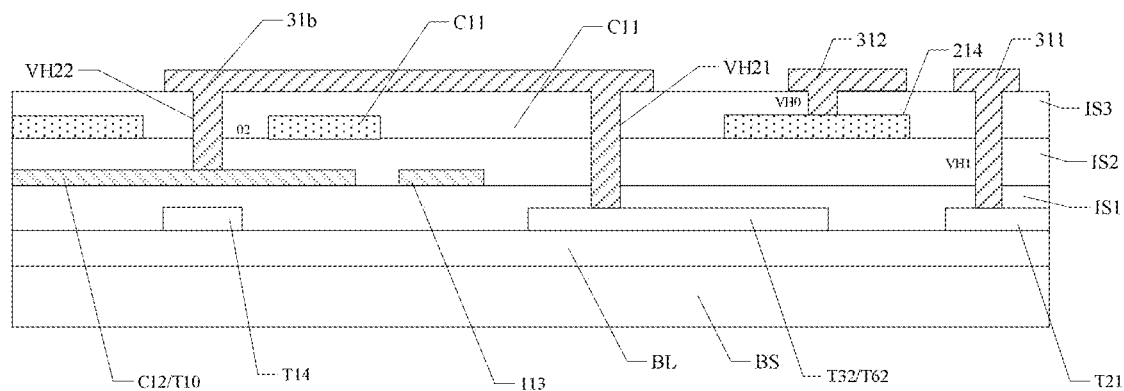
FIG. 7C is a cross-sectional view of FIG. 3A taken along line X-Y.

FIG. 7C is a cross-sectional view of FIG. 3A taken along line X-Y. As illustrated in FIG. 7C, the first power line 312 is electrically connected with the connection element 214 through the via hole VH0. The data line 311 is electrically connected with the first electrode T21 of the data writing transistor T2 through the via hole VH1. One end of the second connection electrode 31b is electrically connected with the second electrode T62 of the first reset transistor T6 through the via hole VH21, and the other end of the second connection electrode 31b is electrically connected with the gate electrode T10 (i.e., the second electrode C12 of the storage capacitor C1) of the driving transistor T1 through the via hole VH22.

Figure 8A:
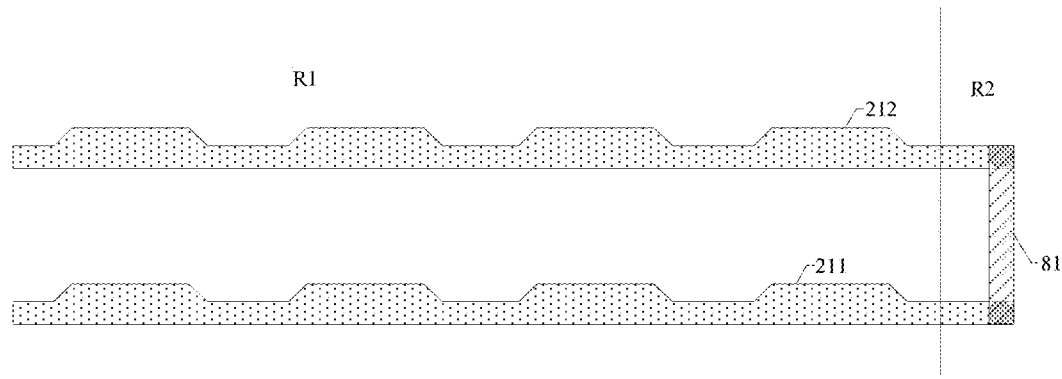
FIG. 8A is a schematic diagram of electrically connecting a first initialization signal line with a second initialization signal line in a display substrate provided by an embodiment of the present disclosure.

FIG. 8A is a schematic diagram of electrically connecting a first initialization signal line with a second initialization signal line in the display substrate provided by an embodiment of the present disclosure. For example, as illustrated in FIG. 8A, the second initialization signal line 211 and the first initialization signal line 212 are electrically connected with each other. For example, as illustrated in FIG. 8A, the display substrate includes a display region R1 and a peripheral region R2; and the second initialization signal line 211 and the first initialization signal line 212 are electrically connected with each other through a first connection structure 81 located in the peripheral region R2. For example, the second initialization signal line 211 and the first initialization signal line 212 may be located in the same layer, which are separated from the first connection structure 81 by providing an insulation layer therebetween; and both ends of the first connection structure 81 are connected with the second initialization signal line 211 and the first initialization signal line 212 through via holes, respectively. In other embodiments, the second initialization signal line 211 and the first initialization signal line 212 may not be connected, but are configured to be applied with the same signal. For example, in the embodiment of the present disclosure, the first connection structure 81 may be located in the third conductive pattern layer L3, without limited thereto.

Figure 8B:
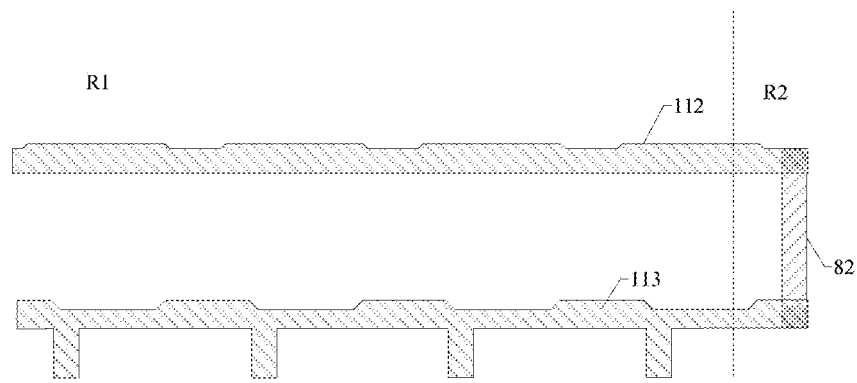
FIG. 8B is a schematic diagram of electrically connecting a second reset control signal line with a gate line in a display substrate provided by an embodiment of the present disclosure.

FIG. 8B is a schematic diagram of electrically connecting a second reset control signal line with a gate line in the display substrate provided by an embodiment of the present disclosure. For example, the second reset control signal line 112 and the gate line 113 are electrically connected with each other. For example, as illustrated in FIG. 8B, the display substrate includes a display region R1 and a peripheral region R2; and the second reset control signal line 112 and the gate line 113 are electrically connected with each other through a second connection structure 82 located in the peripheral region R2. For example, the second reset control signal line 112 and the gate line 113 may be located in the same layer, which are separated from the second connection structure 82 by providing an insulation layer therebetween; and both ends of the second connection structure 82 are connected with the second reset control signal 112 and the gate line 113 through via holes, respectively. In other embodiments, the second reset control signal line 112 and the gate line may not be connected, but are configured to be applied with the same signal. For example, in the embodiment of the present disclosure, the second connection structure 82 may be located in the third conductive pattern layer L3, without limited thereto.

Figure 9:
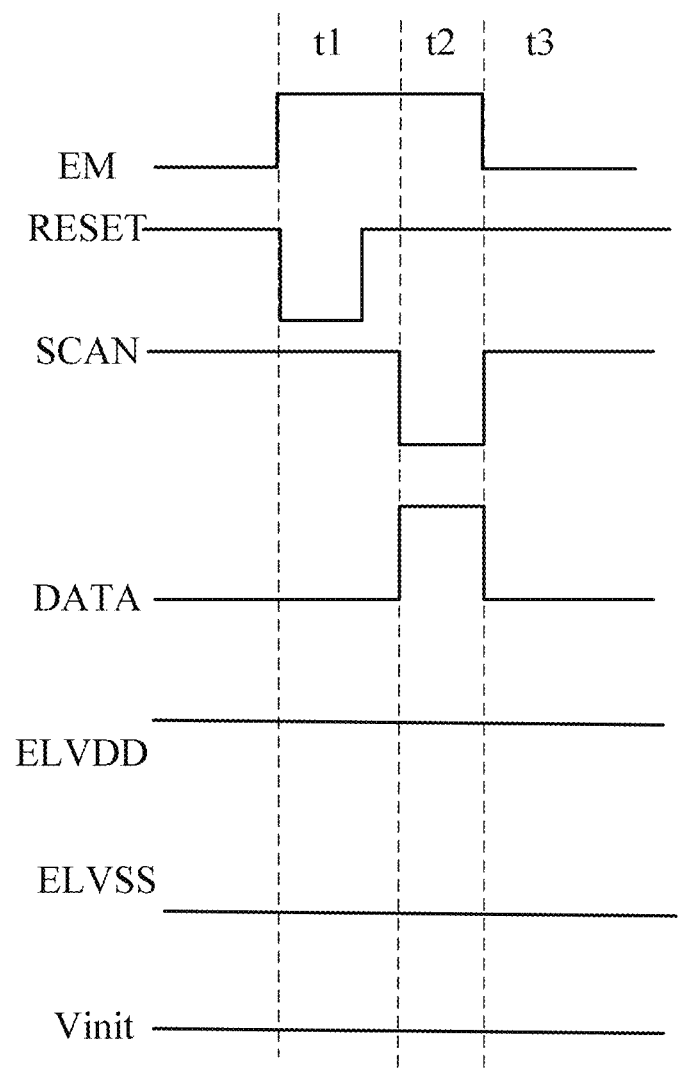
FIG. 9 is a timing signal diagram of a pixel unit in a display panel provided by an embodiment of the present disclosure.

FIG. 9 is a timing signal diagram of a pixel unit in a display panel provided by an embodiment of the present disclosure. Hereinafter, a driving method of one pixel unit in the display panel provided by an embodiment of the present disclosure will be described in conjunction with FIG. 1 and FIG. 9.

As illustrated in FIG. 9, within a display time period of one frame, the driving method of the pixel unit includes a first reset phase t1, a data writing and threshold compensation and second reset phase t2, and a light-emitting phase t3.

In the first reset phase t1, the light-emitting control signal EM is set to be a turn-off voltage; the reset control signal RESET is set to be a turn-on voltage; and the scan signal SCAN is set to be a turn-off voltage.

In the data writing and threshold compensation and second reset phase t2, the light-emitting control signal EM is set to be a turn-off voltage; the reset control signal RESET is set to be a turn-off voltage; and the scan signal SCAN is set to be a turn-on voltage.

In the light-emitting phase t3, the light-emitting control signal EM is set to be a turn-on voltage; the reset control signal RESET is set to be a turn-off voltage; and the scan signal SCAN is set to be a turn-off voltage.

As illustrated in FIG. 9, the first voltage signal ELVDD, the second voltage signal ELVSS, and the initialization signal Vint are all constant voltage signals; and the initialization signal Vint is between the first voltage signal ELVDD and the second voltage signal ELVSS.

For example, in the embodiment of the present disclosure, the turn-on voltage refers to a voltage that can cause a first electrode and a second electrode of a corresponding transistor to be turned on, and the turn-off voltage refers to a voltage that can cause a first electrode and a second electrode of a corresponding transistor to be turned off. In the case where the transistor is a transistor of P-type, the turn-on voltage is a low voltage (e.g., 0 V), and the turn-off voltage is a high voltage (e.g., 5 V); in the case where the transistor is a transistor of N-type, the turn-on voltage is a high voltage (e.g., 5 V), and the turn-off voltage is a low voltage (e.g., 0 V). Driving waveforms illustrated in FIG. 9 are all described by taking transistors of P-type as an example, that is, the turn-on voltage is a low voltage (e.g., 0 V), and the turn-off voltage is a high voltage (e.g., 5 V).

Referring to FIG. 1 and FIG. 9 together, in the first reset phase t1, the light-emitting control signal EM is a turn-off voltage; the reset control signal RESET is a turn-on voltage; and the scan signal SCAN is a turn-off voltage. In this case, the first reset transistor T6 is in a turn-on state; while the data writing transistor T2, the threshold compensation transistor T3, the first light-emitting control transistor T4, and the second light-emitting control transistor T5 are in a turn-off state. An initialization signal (an initialization voltage) Vint is transmitted to the gate electrode of the driving transistor T1 by the first reset transistor T6 and then is stored by the storage capacitor C1, so as to reset the driving transistor T1 and eliminate the data stored during emitting light in the last time (a previous frame).

In the data writing and threshold compensation and second reset phase t2, the light-emitting control signal EM is a turn-off voltage; the reset control signal RESET is a turn-off voltage; and the scan signal SCAN is a turn-on voltage. In this case, the data writing transistor T2 and the threshold compensation transistor T3 are in a turn-on state; the second reset transistor T7 is in a turn-on state; and the second reset transistor T7 transmits the initialization signal Vint to the first electrode of the light-emitting element 20 to reset the light-emitting element 20; while the first light-emitting control transistor T4, the second light-emitting control transistor T5, the first reset transistor T6, and the second reset transistor T7 are in a turn-off state. At this time, the data writing transistor T2 transmits the data signal voltage VDATA to the first electrode of the driving transistor T1, that is, the data writing transistor T2 receives the scan signal SCAN and the data signal DATA and writes the data signal DATA into the first electrode of the driving transistor T1 according to the scan signal SCAN. The threshold compensation transistor T3 is turned on to connect the driving transistor T1 into a diode structure, so that the gate electrode of the driving transistor T1 can be charged. After the charging is completed, a gate voltage of the driving transistor T1 is VDATA+Vth, where, VDATA is a data signal voltage and Vth is a threshold voltage of the driving transistor T1, that is, the threshold compensation transistor T3 receives the scan signal SCAN and performs threshold voltage compensation on the gate voltage of the driving transistor T1. In this phase, a voltage difference between both ends of the storage capacitor C1 is ELVDD-VDATA-Vth.

In the light-emitting phase t3, the light-emitting control signal EM is a turn-on voltage; the reset control signal RESET is a turn-off voltage; and the scan signal SCAN is a turn-off voltage. The first light-emitting control transistor T4 and the second light-emitting control transistor T5 are in a turn-on state; while the data writing transistor T2, the threshold compensation transistor T3, the first reset transistor T6, and the second reset transistor T7 are in a turn-off state. The first power signal ELVDD is transmitted to the first electrode of the driving transistor T1 through the first light-emitting control transistor T4; the gate voltage of the driving transistor T1 is maintained at VDATA+Vth; and a light-emitting current I flows into the light-emitting element 20 through the first light-emitting control transistor T4, the driving transistor T1, and the second light-emitting control transistor T5, so that the light-emitting element 20 emits light. That is, the first light-emitting control transistor T4 and the second light-emitting control transistor T5 receive the light-emitting control signal EM, and control the light-emitting element 20 to emit light according to the light-emitting control signal EM. The light-emitting current I satisfies the following saturation current formula:

$$K(Vgs-Vth)^2 = K(VDATA+Vth-ELVDD-Vth)^2 = K(VDATA-ELVDD)^2$$

Where, $$K = 0.5\mu_n Cox \frac{W}{L},$$

$\mu_n$ is channel mobility of the driving transistor, Cox is a channel capacitance per unit area of the driving transistor T1, W and L are a channel width and a channel length of the driving transistor T1, respectively, and Vgs is a voltage difference between the gate electrode and the source electrode (i.e., the first electrode of the driving transistor T1 according to this embodiment) of the driving transistor T1.

It can be seen from the above formula that, the current flowing through the light-emitting element 20 is independent of the threshold voltage of the driving transistor T1. Therefore, the pixel circuit structure is very well compensated for the threshold voltage of the driving transistor T1.

For example, a ratio of duration of the light-emitting phase t3 to a display time period of one frame may be adjusted. In this way, light-emitting brightness may be controlled by adjusting the ratio of the duration of the light-emitting phase t3 to the display time period of one frame. For example, the ratio of the duration of the light-emitting phase t3 to the display time period of one frame is adjusted by controlling the scan driving circuit 103 in the display panel or a driving circuit additionally provided.

For example, in other embodiments, the first reset transistor T6 or the second reset transistor T7, etc. may not be provided, that is, the embodiments of the present disclosure are not limited to the specific pixel circuit illustrated in FIG. 1, and other pixel circuit that can implement compensation to the driving transistor may be used. Based on the description and teaching of the implementations of the present disclosure, other arrangements that can be easily conceived by those skilled in the art without any inventive work are within the protection scope of the present disclosure.

In the embodiment of the present disclosure, in a direction perpendicular to the base substrate, the light transmission hole 01 has a certain size, so it is referred to as a hole; the light transmission hole 01 is an imaging pinhole; and no wirings are provided in a position where the light transmission hole 01 is located, to avoid affecting light transmittance of the light transmission hole 01. For example, none of the first conductive pattern layer, the second conductive pattern layer, and the third conductive pattern layer as described above is provided with metal wirings in the position of the light transmission hole 01, so as to form the light transmission hole 01.

Another embodiment of the present disclosure further provides a display device, including any one of the above-described display substrates. The display device may include an OLED display, as well as any product or component having a display function including the OLED display such as a television, a digital camera, a mobile phone, a watch, a tablet personal computer, a laptop, a navigator, etc.

It should be explained that, for the purpose of clarity only, in accompanying drawings for illustrating the embodiment(s) of the present disclosure, the thickness and size of a layer or a region may be enlarged. However, it should be understood that, in the case where a component or element such as a layer, film, area, substrate or the like is referred to be "on" or "under" another component or element, it may be directly on or under the another component or element or a component or element is interposed therebetween.

In the embodiments of the present disclosure, the shape of each element is only schematically described, and is not limited to what is shown in the figure, and can be determined according to needs.

In the embodiments of present disclosure, patterning or a patterning process may only include a photolithography process, or include a photolithography process and an etching process, or include other processes such as a printing process, and an inkjet process to form a preset pattern, no limitation will be given here. A photolithography process includes forming a pattern by processes such as film forming, exposure, and development etc., by using photoresist, mask, exposure machine etc. A proper process can be selected according to the structure to be formed in the embodiments of the present disclosure.

In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display substrate, comprising:
a base substrate, comprising a display region;
a plurality of pixel units, located in the display region, each of the plurality of pixel units comprising a pixel circuit structure and a light-emitting element, the light-emitting element comprising a first electrode, the first electrode being located at a side of the pixel circuit structure away from the base substrate, the plurality of pixel units comprising a first pixel unit and a second pixel unit that are adjacent to each other in a first direction;
a first initialization signal line, extending in the first direction;
a light-emitting control signal line, extending in the first direction;
a first power line, extending in a second direction, the second direction intersecting with the first direction;
a first data line, extending in the second direction, the first data line being connected with the pixel circuit structure of the first pixel unit;
a second data line, extending in the second direction, the second data line being connected with the pixel circuit structure of the second pixel unit, the first data line and the second data line being arranged at two sides of the first power line, respectively; and
a light transmission hole, an orthographic projection of the light transmission hole on the base substrate being not overlapped with an orthographic projection of the first electrode on the base substrate,
wherein the light transmission hole is located in a region enclosed by the first initialization signal line, the light-emitting control signal line, the first power line, and the second data line.

2. The display substrate according to claim 1, wherein a distance between the second data line and the first power line is greater than a distance between the first data line and the first power line.

3. The display substrate according to claim 1, wherein the pixel circuit structure further comprises a first light-emitting control transistor and a second light-emitting control transistor,
the first light-emitting control transistor comprises a first electrode and a second electrode, and the first electrode and the second electrode of the first light-emitting control transistor are located at a first side and a second side of the light-emitting control signal line, respectively,
the second light-emitting control transistor comprises a first electrode and a second electrode, and the second electrode and the first electrode of the second light-emitting control transistor are located at the first side and the second side of the light-emitting control signal line, respectively,
the first side and the second side are opposite sides of the light-emitting control signal line, and
the light transmission hole is located between the first electrode of the first light-emitting control transistor and the second electrode of the second light-emitting control transistor.

4. The display substrate according to claim 3, wherein a gate electrode of the first light-emitting control transistor and a gate electrode of the second light-emitting control transistor are both connected with the light-emitting control signal line,
wherein the first light-emitting control transistor, the light transmission hole, and the second light-emitting control transistor are arranged in the first direction.

5. The display substrate according to claim 3, wherein the pixel circuit structure further comprises a driving transistor located at the second side of the light-emitting control signal line,
the first electrode and the second electrode of the first light-emitting control transistor are electrically connected with the first power line and a first electrode of the driving transistor, respectively,
the first electrode and the second electrode of the second light-emitting control transistor are electrically connected with a second electrode of the driving transistor and the first electrode of the light-emitting element, respectively.

6. The display substrate according to claim 5, further comprising
a second initialization signal line, a first reset control signal line, and a second reset control signal line, wherein the pixel circuit structure further comprises a first reset transistor and a second reset transistor,
a gate electrode of the first reset transistor is electrically connected with the first reset control signal line, a first electrode of the first reset transistor is electrically connected with the second initialization signal line through a first connection electrode, and a second electrode of the first reset transistor is electrically connected with a gate electrode of the driving transistor through a second connection electrode,
a gate electrode of the second reset transistor is electrically connected with the second reset control signal line, a first electrode of the second reset transistor is electrically connected with the first initialization signal line through a third connection electrode, and a second electrode of the second reset transistor is electrically connected with the first electrode of the light-emitting element.

7. The display substrate according to claim 6, wherein the second initialization signal line extends in the first direction, the first reset control signal line extends in the first direction, and the second reset control signal line extends in the first direction,
wherein the light transmission hole is further located between the driving transistor and the second reset transistor.

8. The display substrate according to claim 6, further comprising
a gate line and a second power line, wherein the pixel circuit structure further comprises a storage capacitor, a data writing transistor, and a threshold compensation transistor,
a first electrode of the storage capacitor is electrically connected with the first power line, and a second electrode of the storage capacitor is electrically connected with a second electrode of the threshold compensation transistor through the second connection electrode,
a gate electrode of the data writing transistor is electrically connected with the gate line, and a first electrode and a second electrode of the data writing transistor of the first pixel unit are electrically connected with the first data line and the first electrode of the driving transistor of the first pixel unit, respectively, a gate electrode of the threshold compensation transistor is electrically connected with the gate line, a first electrode of the threshold compensation transistor is electrically connected with the second electrode of the driving transistor, and the second electrode of the threshold compensation transistor is electrically connected with the gate electrode of the driving transistor through the second connection electrode, and
a second electrode of the light-emitting element is electrically connected with the second power line.

9. The display substrate according to claim 8,
wherein an edge of the first power line that is close to the first data line has an equal distance with respect to the first data line at various positions.

10. The display substrate according to claim 8,
wherein the gate line extends in the first direction, and the gate line is located between the light-emitting control signal line and the first reset control signal line.

11. The display substrate according to claim 8,
wherein the second reset control signal line and the gate line are electrically connected with each other, or the second reset control signal line and the gate line are configured to be applied with a same signal.

12. The display substrate according to claim 5,
wherein the driving transistor and the second reset transistor are arranged at two sides of the light transmission hole, respectively, and the two sides of the light transmission hole are opposite to each other in the second direction.

13. The display substrate according to claim 5,
wherein the second reset control signal line, the first initialization signal line, the light-emitting control signal line, the first reset control signal line, and the second initialization signal line are sequentially arranged in the second direction.

14. The display substrate according to claim 5,
wherein the first initialization signal line and the second initialization signal line are electrically connected with each other, or the first initialization signal line and the second initialization signal line are configured to be applied with a same signal.

15. The display substrate according to claim 1,
wherein a size of the light transmission hole in the first direction is in a range from 5 μm to 15 μm, and a size of the light transmission hole in the second direction is in a range from 5 μm to 15 μm.

16. A display device, comprising the display substrate according to claim 1.

17. A display substrate, comprising:
a pixel circuit structure, the pixel circuit structure comprising a first light-emitting control transistor and a second light-emitting control transistor;
a light-emitting control signal line, a gate electrode of the first light-emitting control transistor and a gate electrode of the second light-emitting control transistor being both connected with the light-emitting control signal line;
a light-emitting element, comprising a first electrode, the first electrode being located at a side of the pixel circuit structure away from a base substrate; and
a light transmission hole, located between the first light-emitting control transistor and the second light-emitting control transistor, an orthographic projection of the light transmission hole on the base substrate being not overlapped with an orthographic projection of the first electrode on the base substrate,
wherein the light-emitting control signal line extends in a first direction, and
the first light-emitting control transistor, the light transmission hole, and the second light-emitting control transistor are arranged in the first direction,
the display substrate further comprises:
a first power line, wherein the light transmission hole is located at a first side of the light-emitting control signal line, the pixel circuit structure further comprises a driving transistor located at a second side of the light-emitting control signal line, the first side and the second side are opposite sides of the light-emitting control signal line,
a first electrode and a second electrode of the first light-emitting control transistor are electrically connected with the first power line and a first electrode of the driving transistor, respectively,
a first electrode and a second electrode of the second light-emitting control transistor are electrically connected with a second electrode of the driving transistor and the first electrode of the light-emitting element, respectively, and
the first power line extends in a second direction, and the second direction intersects with the first direction,
the display substrate further comprises a first initialization signal line, a second initialization signal line, a first reset control signal line, and a second reset control signal line, wherein the pixel circuit structure further comprises a first reset transistor and a second reset transistor,
a gate electrode of the first reset transistor is electrically connected with the first reset control signal line, a first electrode of the first reset transistor is electrically connected with the second initialization signal line through a first connection electrode, and a second electrode of the first reset transistor is electrically connected with a gate electrode of the driving transistor through a second connection electrode, and
a gate electrode of the second reset transistor is electrically connected with the second reset control signal line, a first electrode of the second reset transistor is electrically connected with the first initialization signal line through a third connection electrode, and a second electrode of the second reset transistor is electrically connected with the first electrode of the light-emitting element.

18. A display substrate, comprising:
a pixel circuit structure, the pixel circuit structure comprising a first light-emitting control transistor and a second light-emitting control transistor;
a light-emitting control signal line, a gate electrode of the first light-emitting control transistor and a gate electrode of the second light-emitting control transistor being both connected with the light-emitting control signal line;
a light-emitting element, comprising a first electrode, the first electrode being located at a side of the pixel circuit structure away from a base substrate; and
a light transmission hole, located between the first light-emitting control transistor and the second light-emitting control transistor, an orthographic projection of the light transmission hole on the base substrate being not overlapped with an orthographic projection of the first electrode on the base substrate,
wherein the light-emitting control signal line extends in a first direction, and the first light-emitting control transistor, the light transmission hole, and the second light-emitting control transistor are arranged in the first direction, the display substrate further comprises:

a first power line, wherein the light transmission hole is located at a first side of the light-emitting control signal line, the pixel circuit structure further comprises a driving transistor located at a second side of the light-emitting control signal line, the first side and the second side are opposite sides of the light-emitting control signal line, a first electrode and a second electrode of the first light-emitting control transistor are electrically connected with the first power line and a first electrode of the driving transistor, respectively, a first electrode and a second electrode of the second light-emitting control transistor are electrically connected with a second electrode of the driving transistor and the first electrode of the light-emitting element, respectively, and the first power line extends in a second direction, and the second direction intersects with the first direction, the display substrate further comprises a first initialization signal line, a second initialization signal line, a first reset control signal line, and a second reset control signal line, wherein the pixel circuit structure further comprises a first reset transistor and a second reset transistor, a gate electrode of the first reset transistor is electrically connected with the first reset control signal line, a first electrode of the first reset transistor is electrically connected with the second initialization signal line through a first connection electrode, and a second electrode of the first reset transistor is electrically connected with a gate electrode of the driving transistor through a second connection electrode, and a gate electrode of the second reset transistor is electrically connected with the second reset control signal line, a first electrode of the second reset transistor is electrically connected with the first initialization signal line through a third connection electrode, and a second electrode of the second reset transistor is electrically connected with the first electrode of the light-emitting element, wherein the first initialization signal line extends in the first direction, the second initialization signal line extends in the first direction, the first reset control signal line extends in the first direction, and the second reset control signal line extends in the first direction, wherein the light transmission hole is further located between the driving transistor and the second reset transistor.

* * * * *